US012568662B2

(12) United States Patent
Lai et al.

(10) Patent No.: US 12,568,662 B2
(45) Date of Patent: Mar. 3, 2026

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Te-Yang Lai, Hsinchu (TW); Chun-Yen Peng, Hsinchu (TW); Tsung-Da Lin, Pingtung County (TW); Chi On Chui, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 659 days.

(21) Appl. No.: 17/715,613

(22) Filed: Apr. 7, 2022

(65) Prior Publication Data

US 2023/0223439 A1 Jul. 13, 2023

Related U.S. Application Data

(60) Provisional application No. 63/298,703, filed on Jan. 12, 2022.

(51) Int. Cl.
| | |
|---|---|
| *H10D 62/10* | (2025.01) |
| *H10D 30/01* | (2025.01) |
| *H10D 30/67* | (2025.01) |
| *H10D 84/01* | (2025.01) |
| *H10D 84/03* | (2025.01) |

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01);

*H10D 84/0128* (2025.01); *H10D 84/013* (2025.01); *H10D 84/038* (2025.01)

(58) Field of Classification Search
None
See application file for complete search history.

(56) References Cited

U.S. PATENT DOCUMENTS

| | | | | |
|---|---|---|---|---|
| 6,362,511 | B1 * | 3/2002 | Mizushima | .......... H10D 84/038 257/412 |
| 6,445,033 | B1 * | 9/2002 | Hasegawa | ............ H10D 64/685 257/410 |
| 6,849,925 | B1 | 2/2005 | Halliyal et al. | |
| 7,105,425 | B1 * | 9/2006 | Krivokapic | ............ B82Y 10/00 977/773 |
| 9,209,247 | B2 | 12/2015 | Colinge et al. | |
| 9,236,267 | B2 | 1/2016 | De et al. | |
| 9,331,168 | B2 | 5/2016 | Lin et al. | |
| 9,412,817 | B2 | 8/2016 | Yang et al. | |

(Continued)

FOREIGN PATENT DOCUMENTS

| | | |
|---|---|---|
| CN | 108630538 A | 10/2018 |
| KR | 20160044394 A | 4/2016 |
| TW | 201530770 A | 8/2015 |

*Primary Examiner* — Cory W Eskridge
(74) *Attorney, Agent, or Firm* — Slater Matsil, LLP

(57) ABSTRACT

An embodiment includes a device including a first high-k gate dielectric on a first channel region of a first semiconductor feature, the first high-k gate dielectric being a crystalline layer with a grain size in a range of 10 Å to 200 Å. The device also includes a first gate electrode on the first high-k gate dielectric. The device also includes a source region and a drain region on opposite sides of the first gate electrode.

20 Claims, 21 Drawing Sheets

(56) References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,484,346 B2 | 11/2016 | Chen | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2006/0177975 A1* | 8/2006 | Ahn | H10D 64/685 |
| | | | 438/197 |
| 2008/0118731 A1 | 5/2008 | Srinivasan et al. | |
| 2012/0299113 A1* | 11/2012 | Endo | H01L 21/02356 |
| | | | 257/369 |
| 2017/0323949 A1* | 11/2017 | Loubet | H01L 21/28088 |
| 2018/0175163 A1 | 6/2018 | Barraud et al. | |
| 2018/0261625 A1 | 9/2018 | Huo et al. | |
| 2020/0013622 A1 | 1/2020 | Okuno et al. | |
| 2020/0020762 A1* | 1/2020 | Frank | H01L 21/02354 |
| 2020/0273962 A1 | 8/2020 | Pillarisetty et al. | |
| 2021/0057216 A1 | 2/2021 | Peng et al. | |
| 2021/0098457 A1* | 4/2021 | Cheng | H10D 84/83 |
| 2021/0280415 A1 | 9/2021 | Peng et al. | |
| 2023/0139258 A1* | 5/2023 | Hou | H01L 21/823462 |
| | | | 257/401 |

* cited by examiner

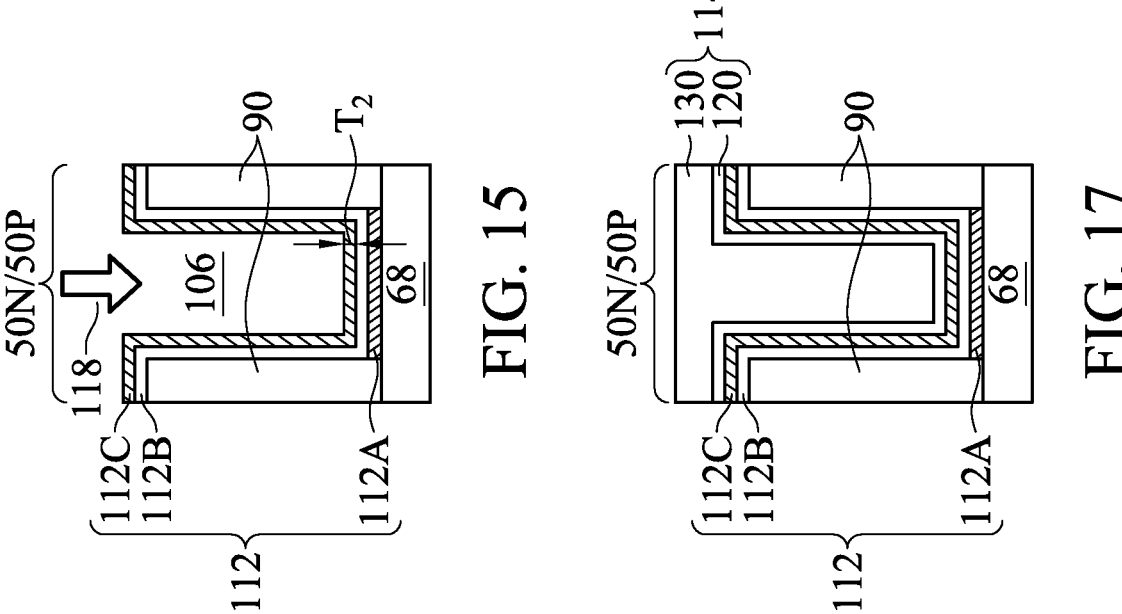
FIG. 14
FIG. 15
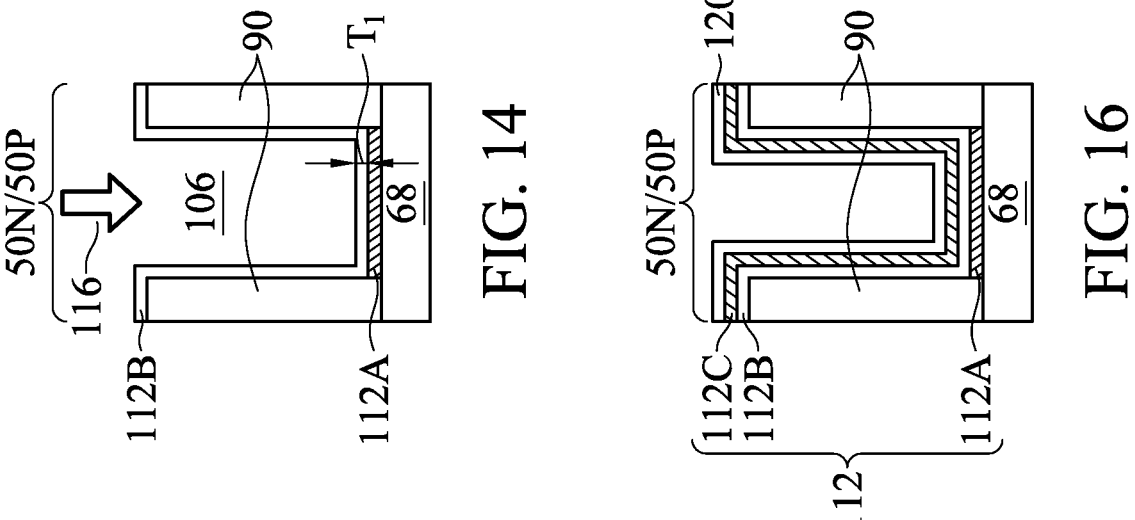
FIG. 16
FIG. 17

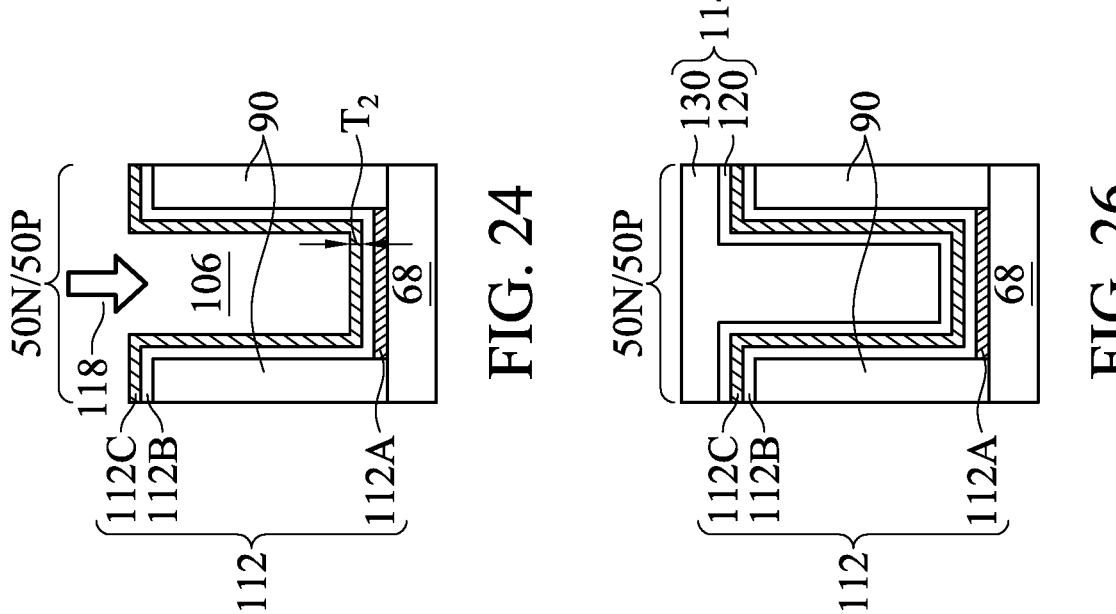
FIG. 23
FIG. 24
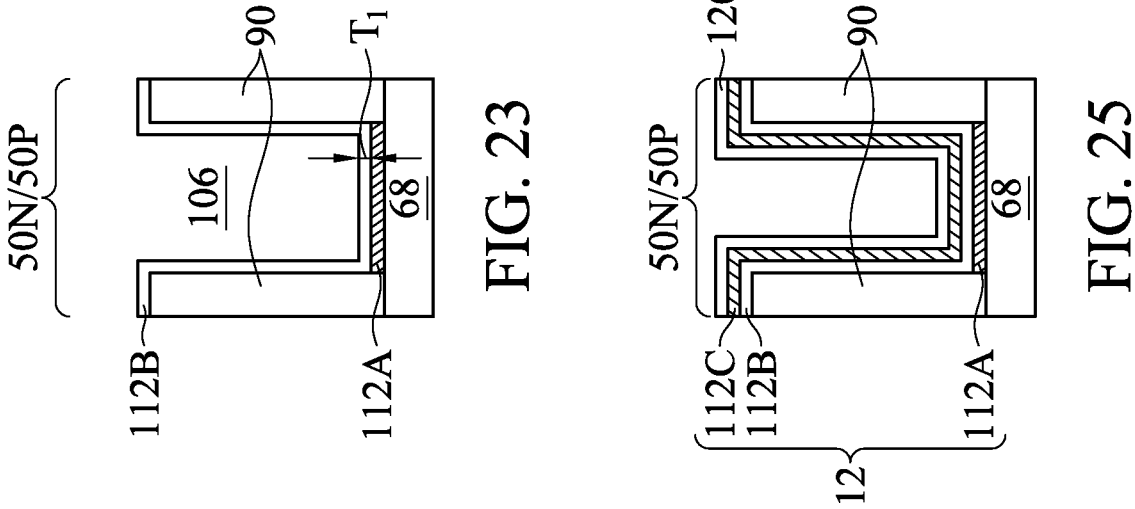
FIG. 25
FIG. 26

SEMICONDUCTOR DEVICES AND METHODS OF FORMING THE SAME

PRIORITY CLAIM AND CROSS-REFERENCE

This application claims the benefit of U.S. Provisional Application No. 63/298,703, filed on Jan. 12, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-17 and 19A-21B are views of intermediate stages in the manufacturing of nano-FETs, in accordance with some embodiments.

FIGS. 23-26 are views of intermediate stages in the manufacturing of devices, in accordance with some embodiments.

DETAILED DESCRIPTION

Figure 1:
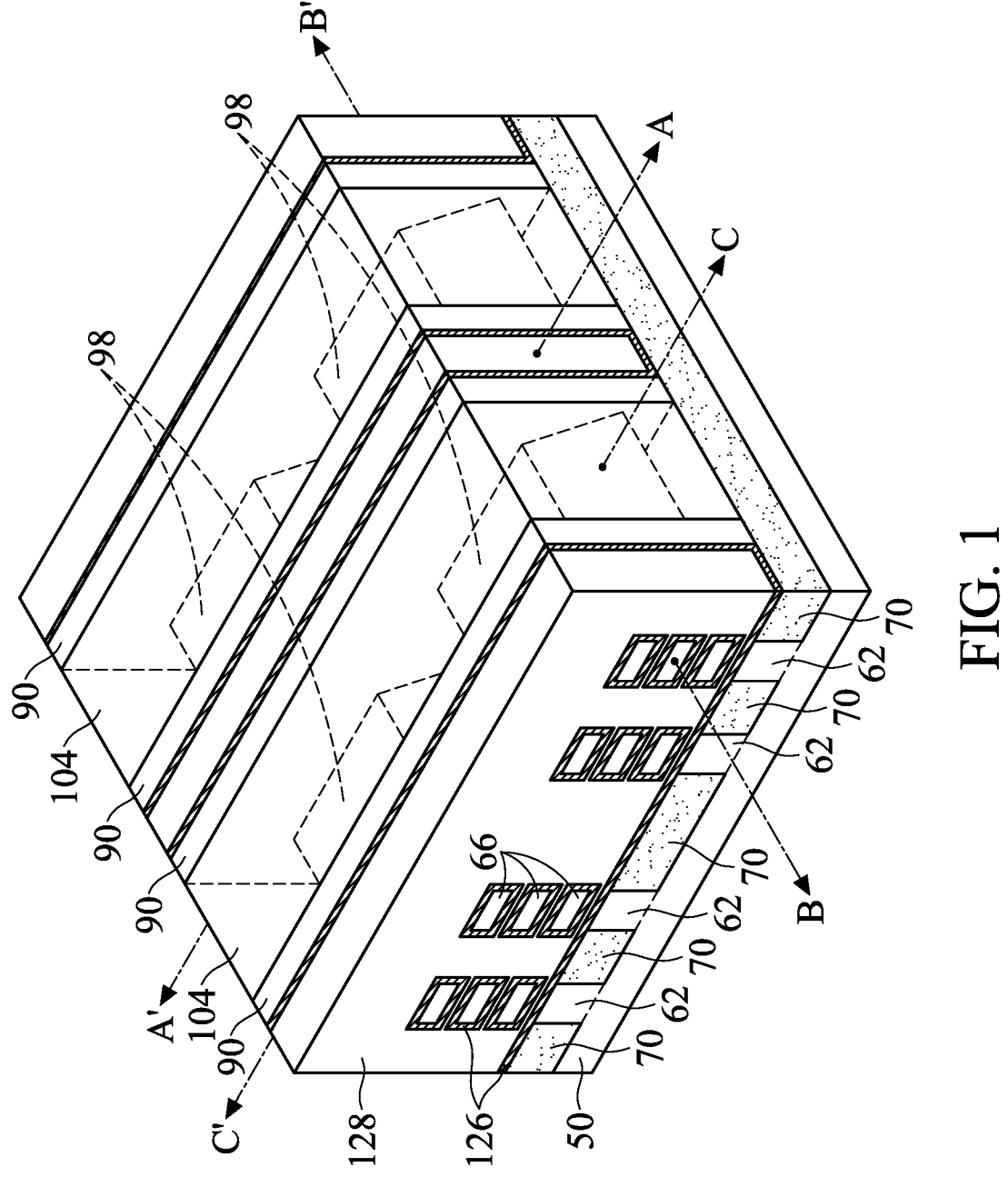
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, replacement gates include gate dielectric layers and gate electrode layers. During formation of the gate dielectric layers, the crystalline phase and grain size of the gate dielectric layer can be controlled to improve the process stability control and the gate length scaling. In some embodiments, a template layer is formed to help control the grain size of the gate dielectric layer and to make the grain size of the gate dielectric layer more uniform. A crystallization process may be performed to help control the grain size of the gate dielectric layer. The crystallization process may include an anneal process, such as a soak anneal, a spike anneal, or both. The grain size of the gate dielectric layer can be sub-nm, such as less than 10 nm. The gate dielectric layer can be a high-k gate dielectric layer.

Embodiments are described in a particular context, a die including nano-FETs. Various embodiments may be applied, however, to dies including other types of transistors (e.g., fin field-effect transistors (FinFETs), planar transistors, or the like) in lieu of or in combination with the nano-FETs. The disclosed embodiments are applicable to complementary metal-oxide-semiconductor (CMOS) FET, ferroelectric (FE) FET, and negative capacitance (NC) FET device applications.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 being semiconductor features which act as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, and the nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials.

Gate dielectrics 132 are wrapped around the top surfaces, sidewalls, and bottom surfaces of the nanostructures 66.

Gate electrodes 134 are over and wrapped around the gate dielectrics 132. Epitaxial source/drain regions 98 are disposed at opposing sides of the gate dielectrics 132 and the gate electrodes 134. An inter-layer dielectric (ILD) 104 is formed over the epitaxial source/drain regions 98. Contacts (subsequently described) to the epitaxial source/drain regions 98 will be formed through the ILD 104. The epitaxial source/drain regions 98 may be shared between various nanostructures 66. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 134 and in a direction, for example, perpendicular to a direction of current flow between the epitaxial source/drain regions 98 of a nano-FET. Cross-section B-B' is along a longitudinal axis of a nanostructure 66 and in a direction of, for example, a current flow between the epitaxial source/drain regions 98 of the nano-FET. Cross-section C-C' is parallel to cross-section A-A' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-17 and 19A-21B are views of intermediate stages in the manufacturing of nano-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 19A, 20A, and 21A are cross-sectional views illustrated along a similar cross-section as reference cross-section A-A' in FIG. 1, except two fins are shown. FIGS. 7B, 8B, 9B, 10B, 11B, 12B, 13B, 14, 15, 16, 17, 19B, 20B, and 21B are cross-sectional views illustrated along a similar cross-section as reference cross-section B-B' in FIG. 1. FIGS. 9C and 9D are cross-sectional views illustrated along a similar cross-section as reference cross-section C-C' in FIG. 1, except two fins are shown.

Figure 2:
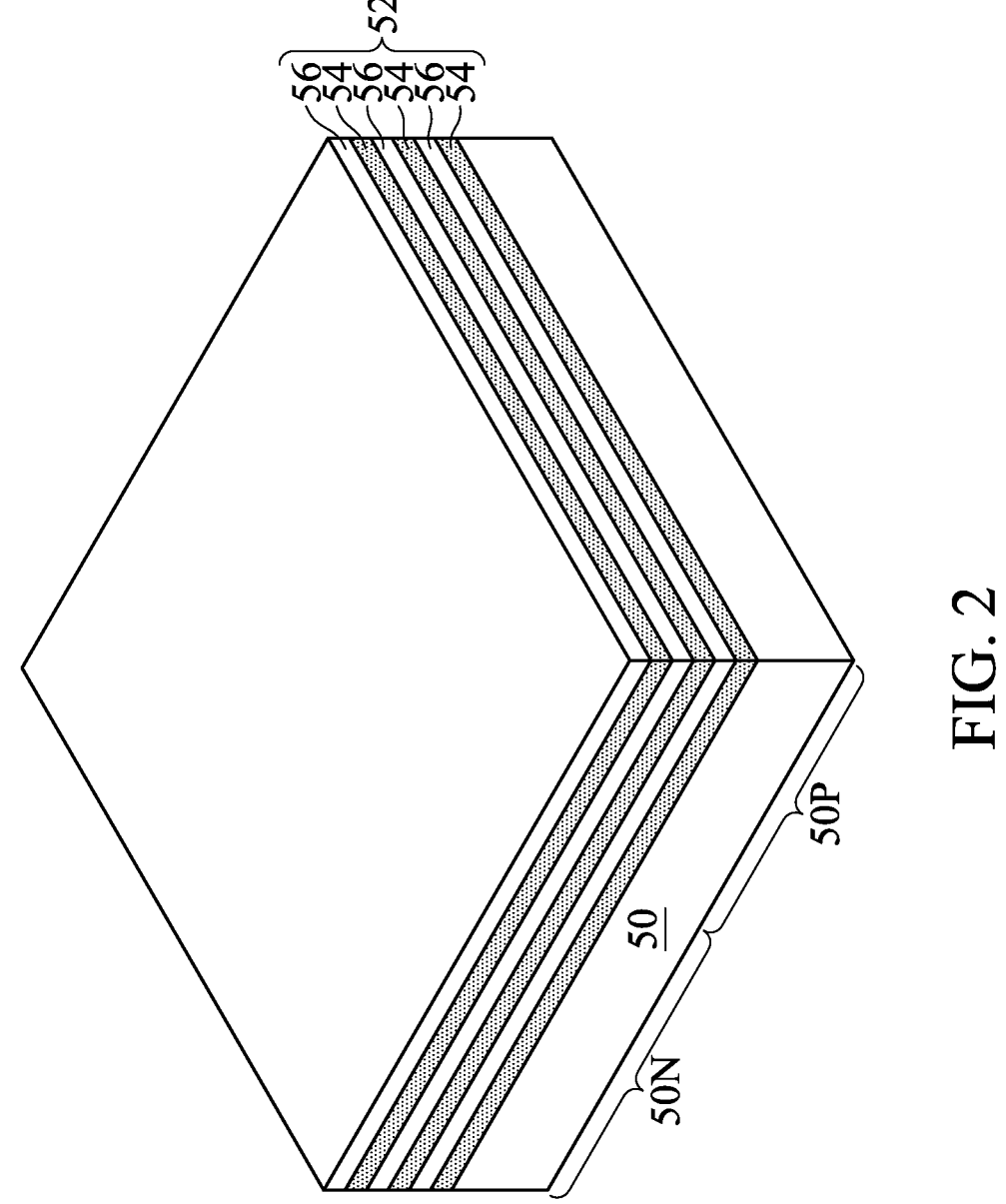

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in the n-type region 50N and the p-type region 50P. The APT region may extend under the source/drain regions in the nano-FETs. The APT region may be used to reduce the leakage from the source/drain regions to the substrate 50. In some embodiments, the impurity concentration in the APT region may be in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in the range of 5 nm to 30 nm. In some embodiments, some layers of the multi-layer stack 52 (e.g., the second semiconductor layers 56) are formed to be thinner than other layers of the multi-layer stack 52 (e.g., the first semiconductor layers 54).

Figure 3:
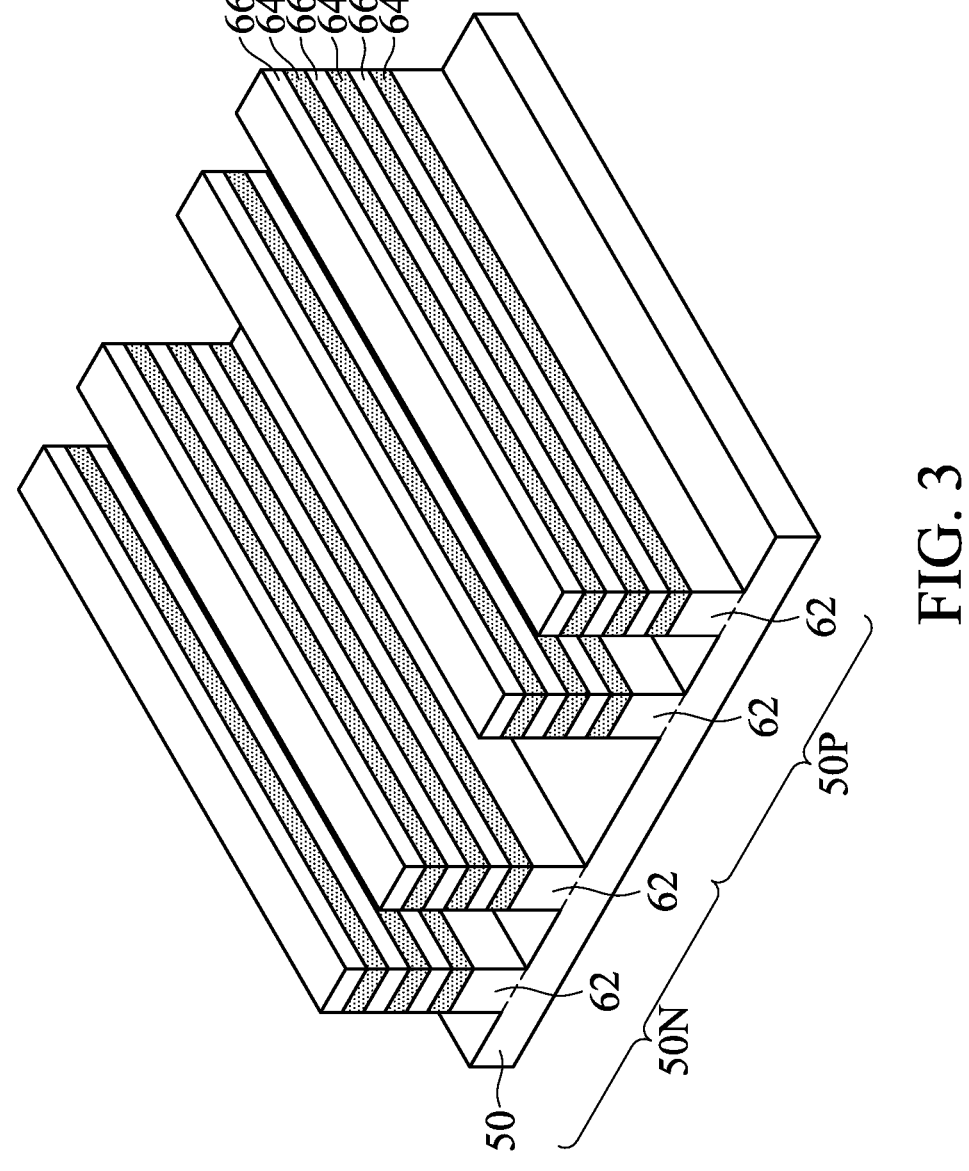

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in the range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
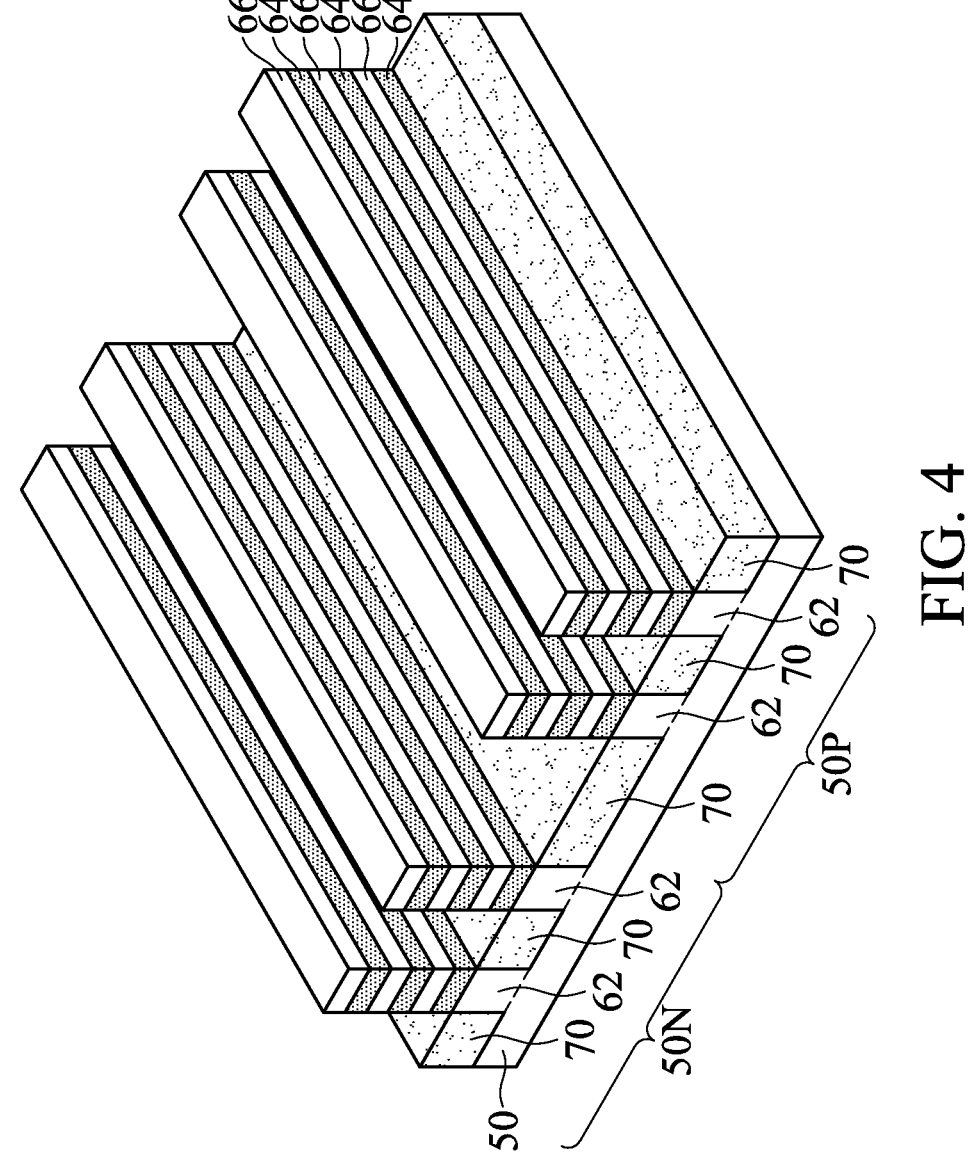

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. Portions of the fins 62 may also protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent nano-FETs.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Portions of the fins 62 may also protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etch process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where, epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50 by doping (e.g., with a p-type or an n-type impurity). The wells may have a conductivity type opposite from a conductivity type of source/drain regions that will be subsequently formed in the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nano structures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where, epitaxial structures are epitaxially grown for the fins 62 and/or the nanostructures 64, 66, the grown materials may be in situ doped during growth, which may obviate the implantations, although in situ and implantation doping may be used together.

Figure 5:
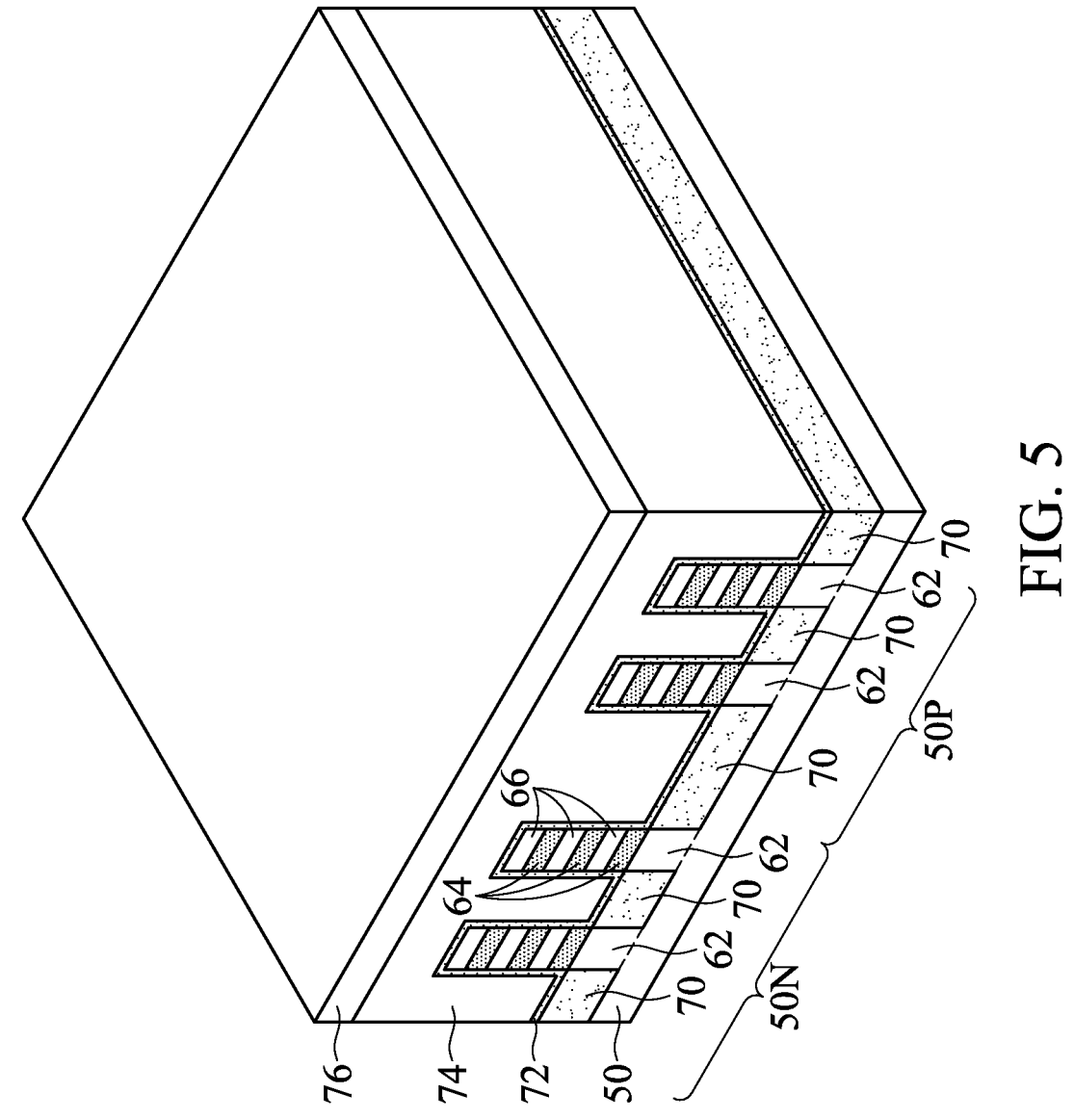

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline silicon (polysilicon), polycrystalline silicon germanium (poly-SiGe), a metal, a metallic nitride, a metallic silicide, a metallic oxide, or the like, which may be formed by a deposition process such as physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
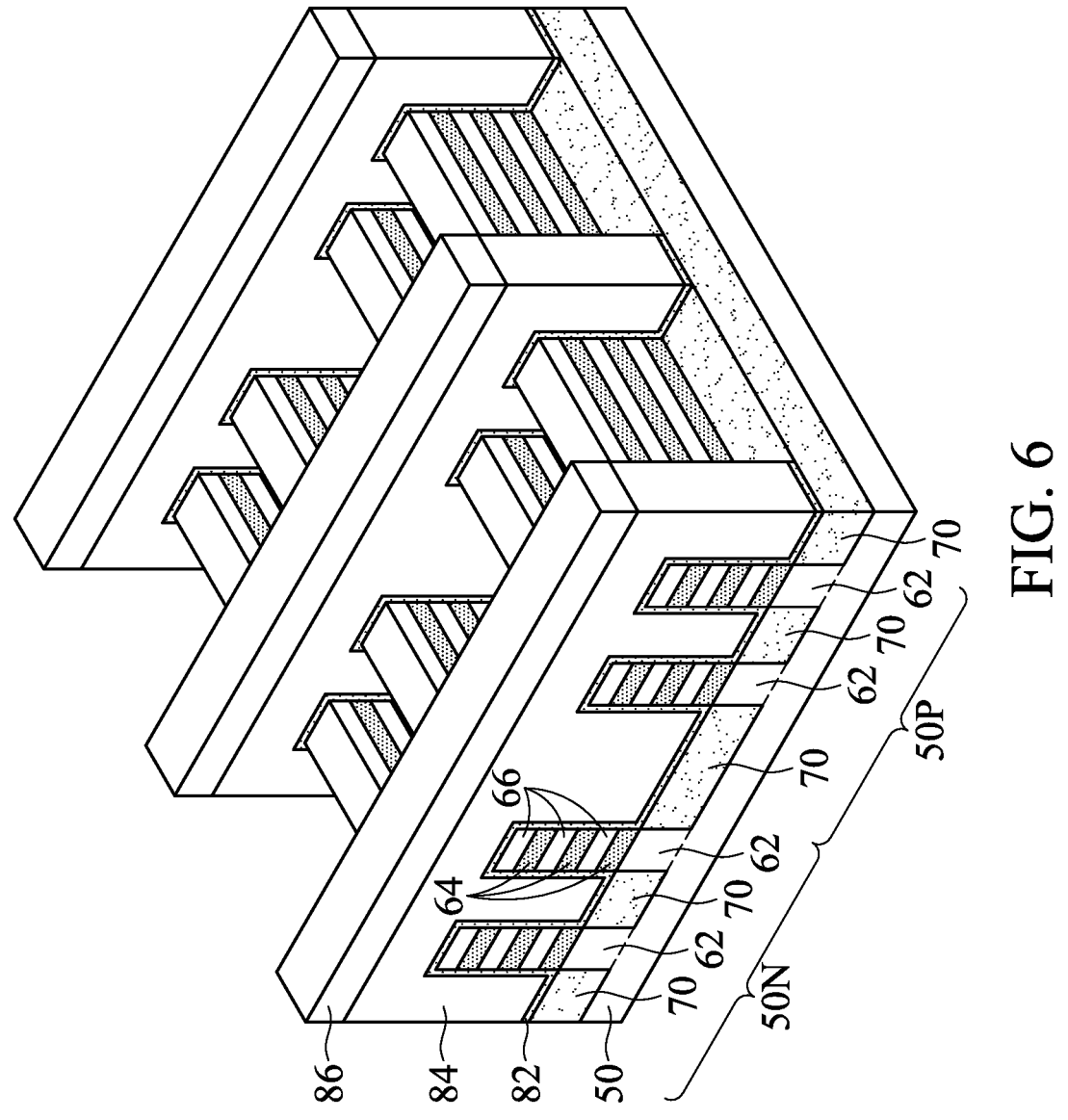

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the second nanostructures 66 that will be patterned to form channel regions 68 (see FIGS. 7A-7B). The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-17 and 19A-21B illustrate various additional steps in the manufacturing of embodiment devices. FIGS. 7A-17 and 19A-21B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 7B:
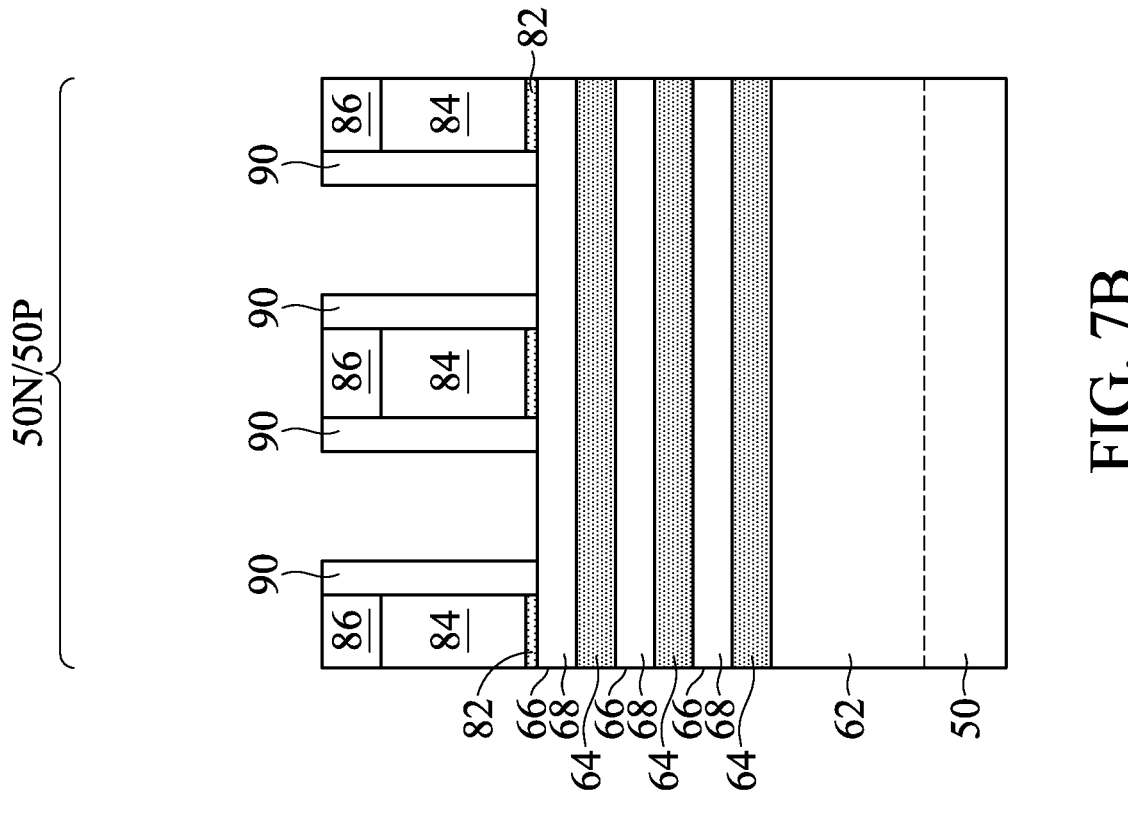
Figure 7A:
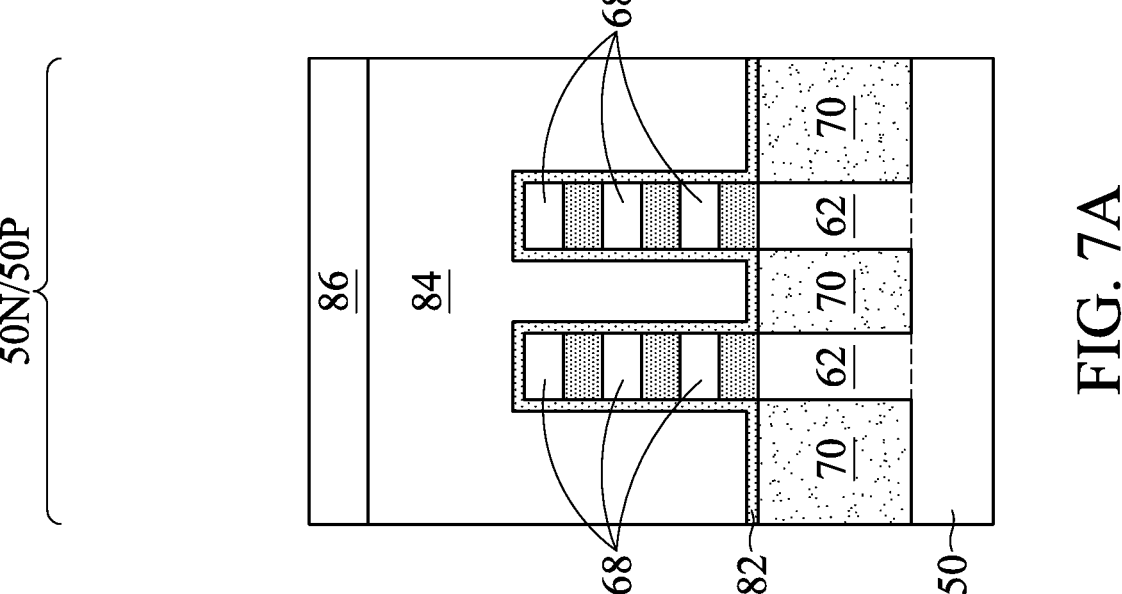

In FIGS. 7A-7B, gate spacers 90 are formed over the nanostructures 64, 66, on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 9C-9D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type (e.g., n-type) impurities may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
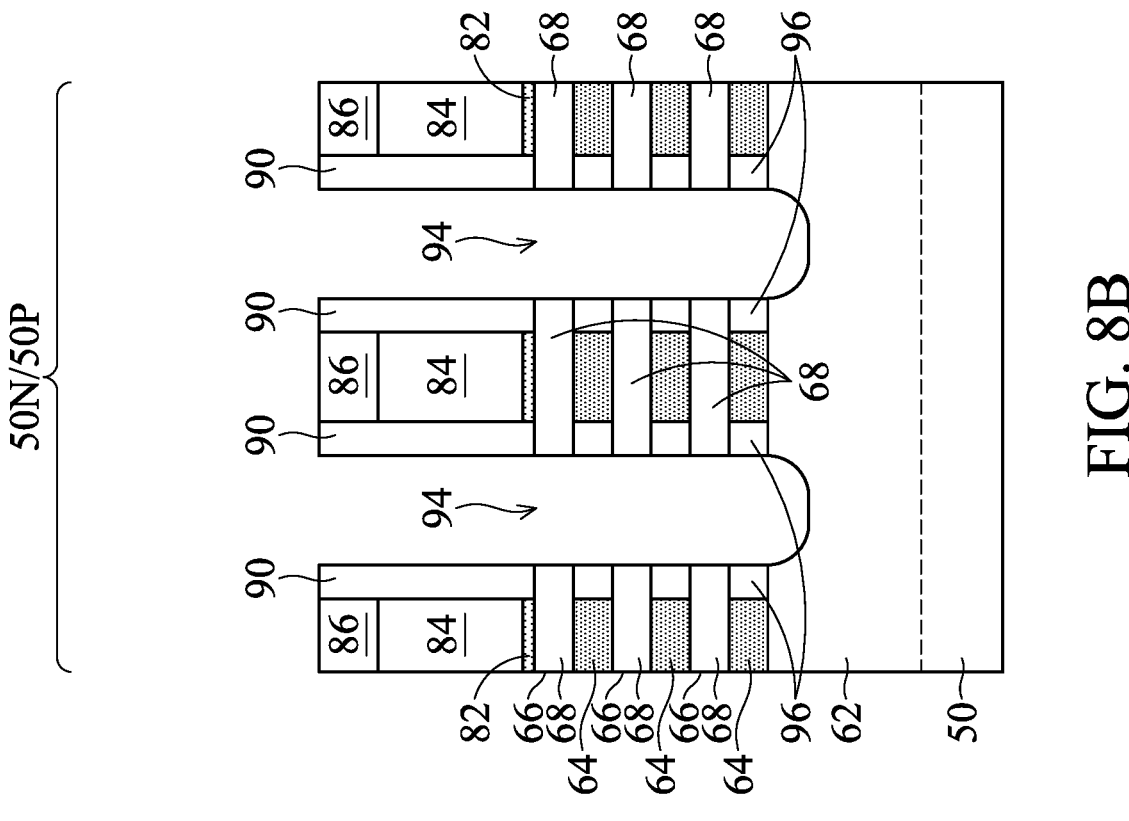
Figure 8A:
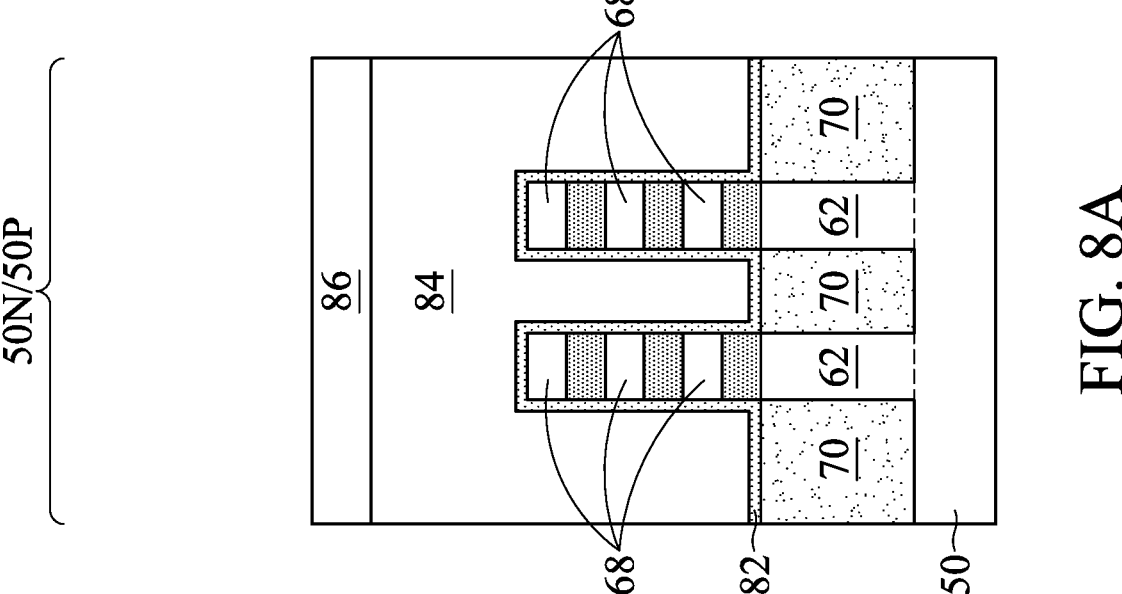

In FIGS. 8A-8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etch process, such as a RIE, a NBE, or the like. The gate spacers 90 and the dummy gates 84 collectively mask portions of the fins 62 and/or the nanostructures 64, 66 during the etch processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etch processes, such as etch processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide (NH$_4$OH), or the like. In another embodiment, the etch process may be a dry etch using a fluorine-based gas such as hydrogen fluoride (HF) gas. In some embodiments, the same etch process may be continually performed to both form the source/drain recesses 94 and recess the sidewalls of the first nanostructures 64. The inner spacers 96 can then be formed by conformally forming an insulating material in the source/drain recesses 94, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figures 9A, 9B:
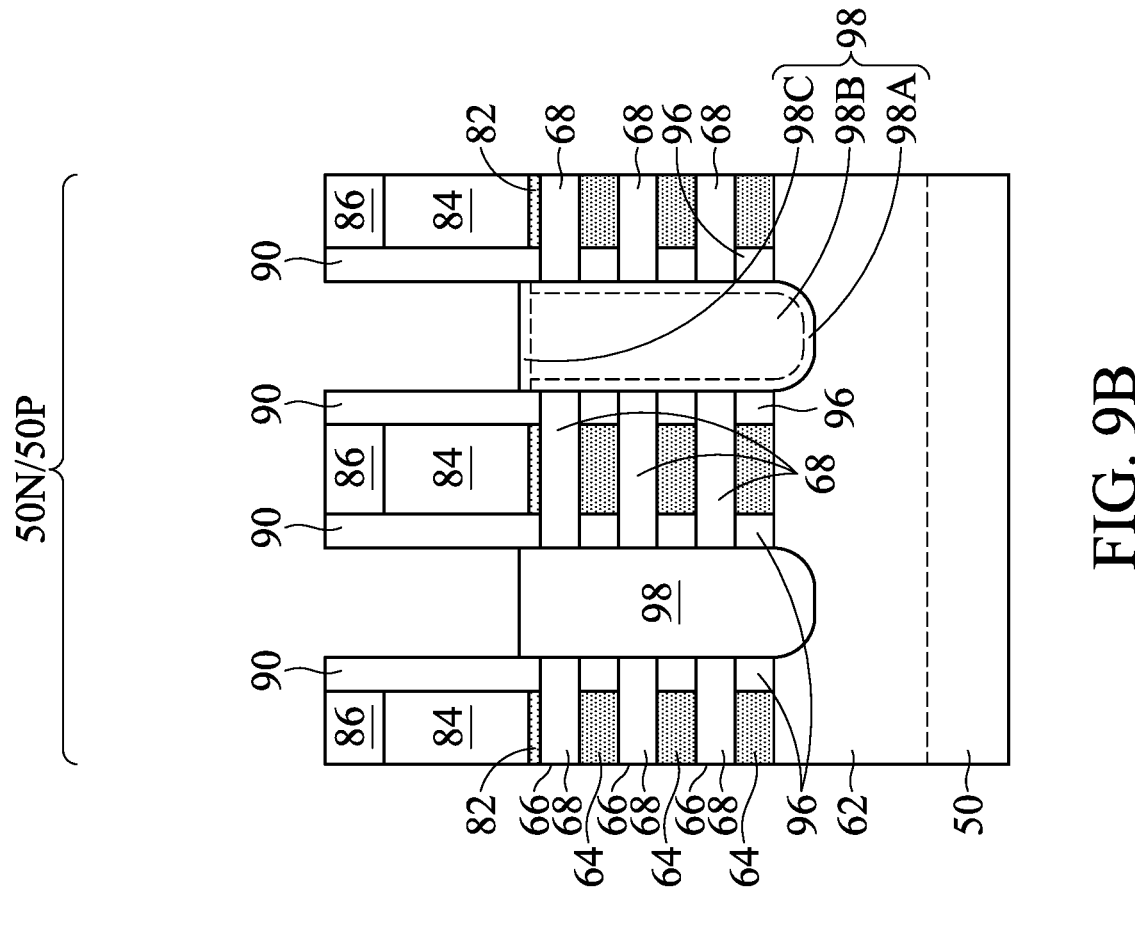
Figure 9D:
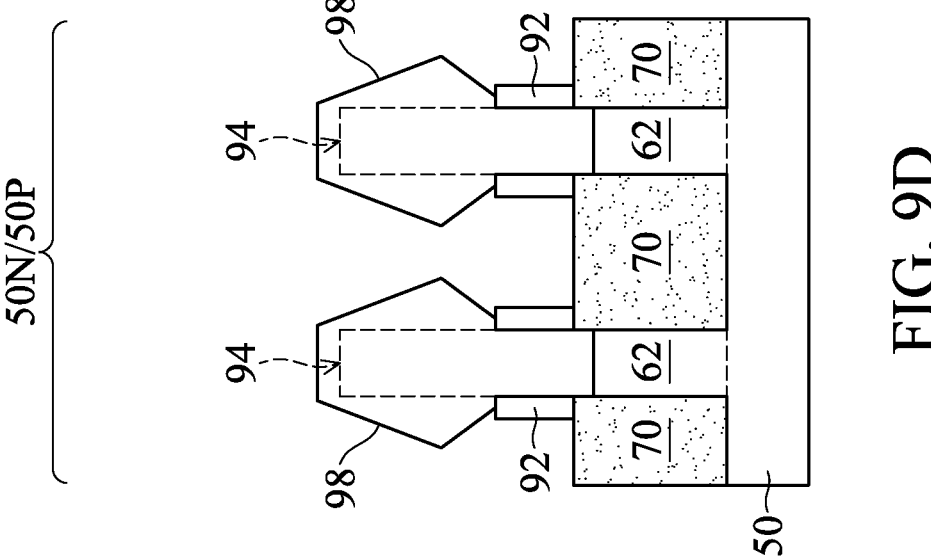
Figure 9C:
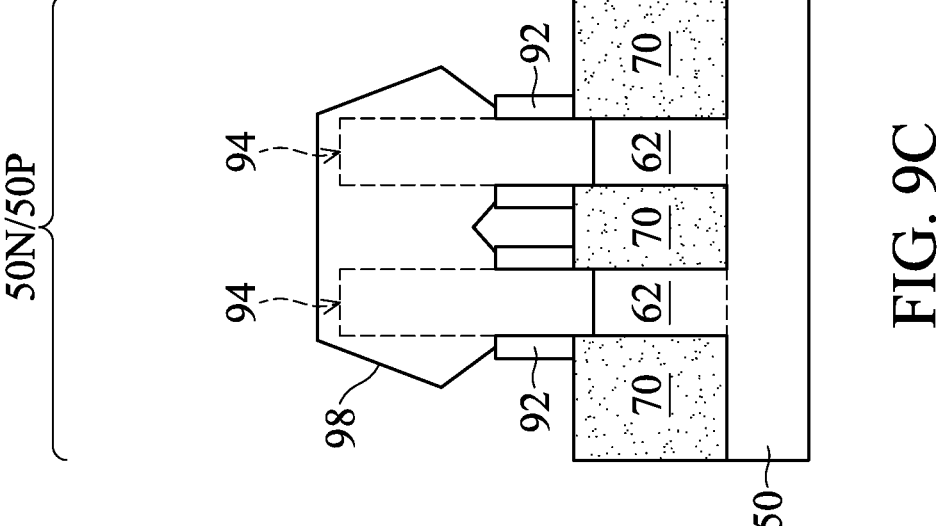

In FIGS. 9A-9B, epitaxial source/drain regions 98 are formed in the source/drain recesses 94. The epitaxial source/drain regions 98 are formed such that each dummy gate 84 (and corresponding channel region 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, if the second nanostructures 66 are silicon, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, if the second nanostructures 66 are silicon, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
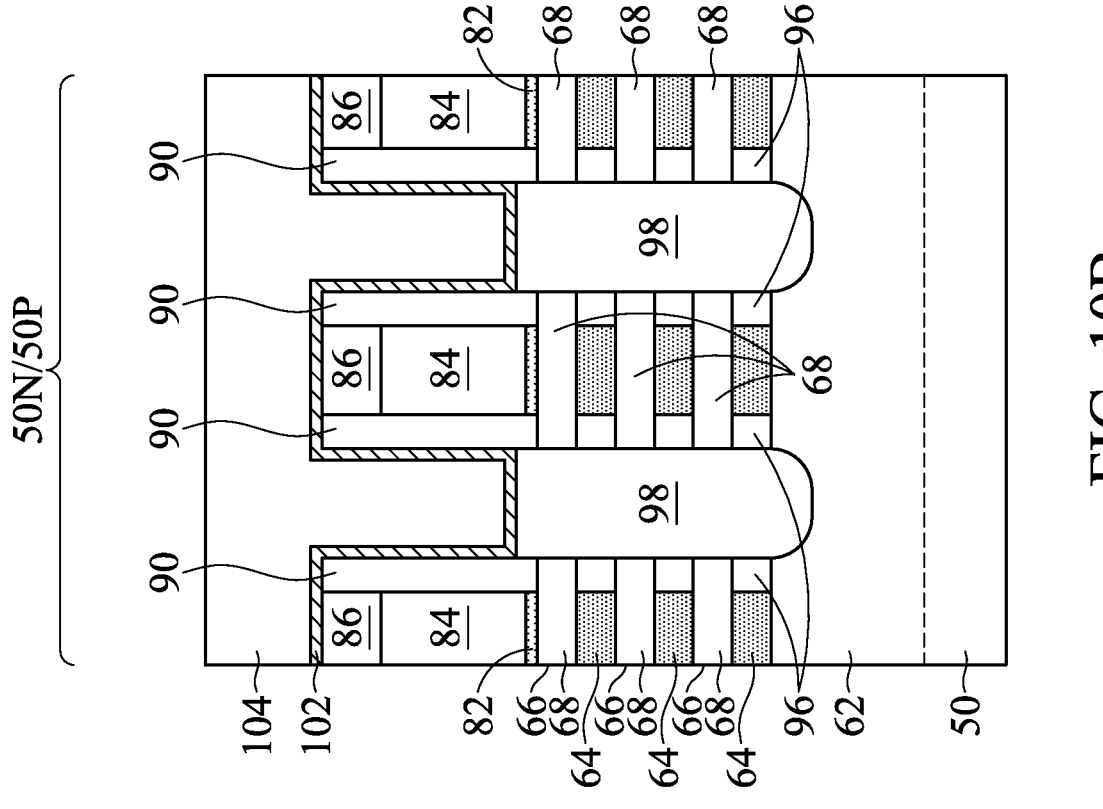
Figure 10A:
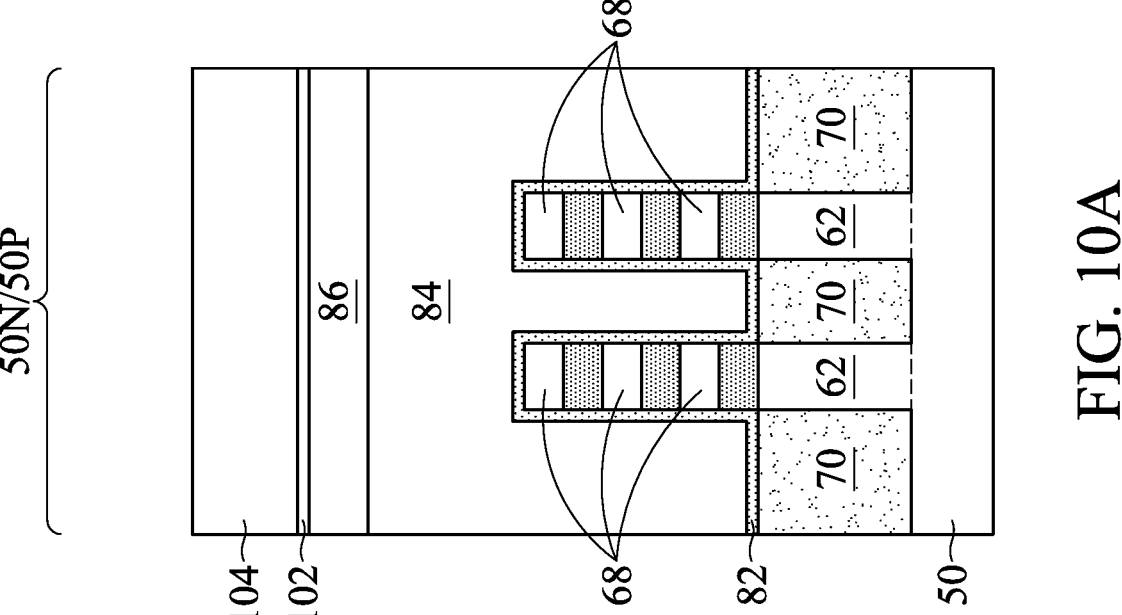

In FIGS. 10A-10B, a first ILD 104 is deposited over the epitaxial source/drain regions 98, the gate spacers 90, and the masks 86 (if present) or the dummy gates 84. The first ILD 104 may be formed of a dielectric material, which may be formed by any suitable deposition process, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material having a high etching selectivity from the etching of the first ILD 104, such as silicon nitride, silicon oxide, silicon oxynitride, or the like, which may be formed by any suitable deposition process, such as CVD, ALD, or the like.

Figure 11B:
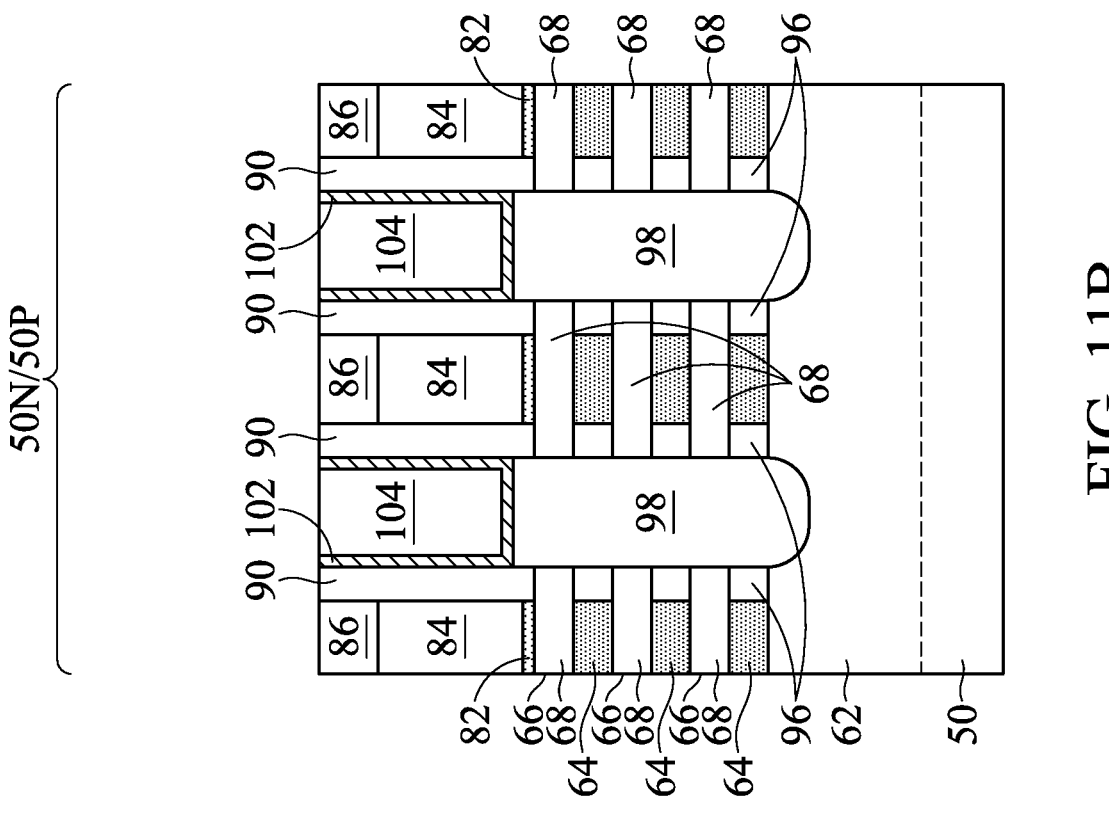
Figure 11A:
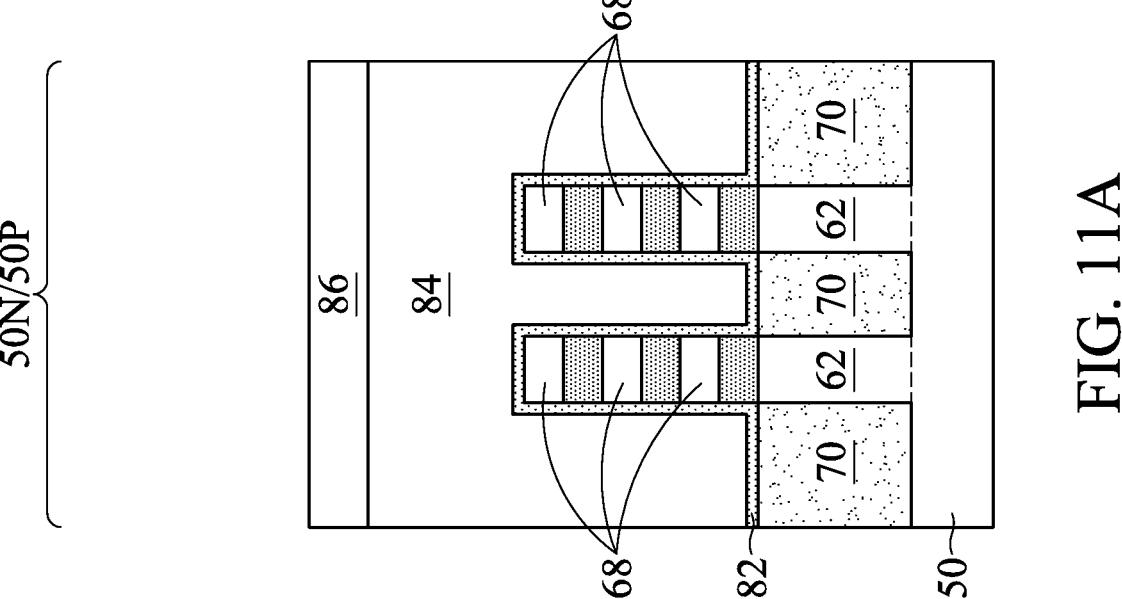

In FIGS. 11A-11B, a removal process is performed to level the top surfaces of the first ILD 104 with the top surfaces of the gate spacers 90 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
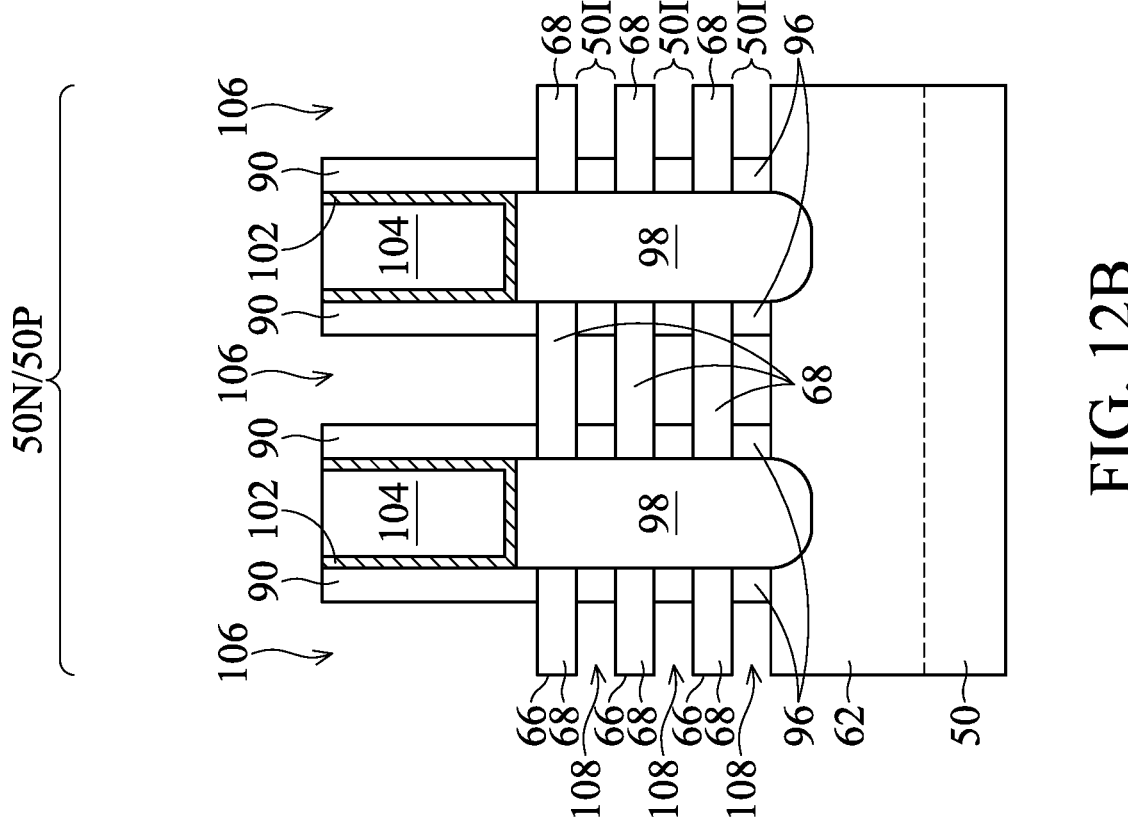
Figure 12A:
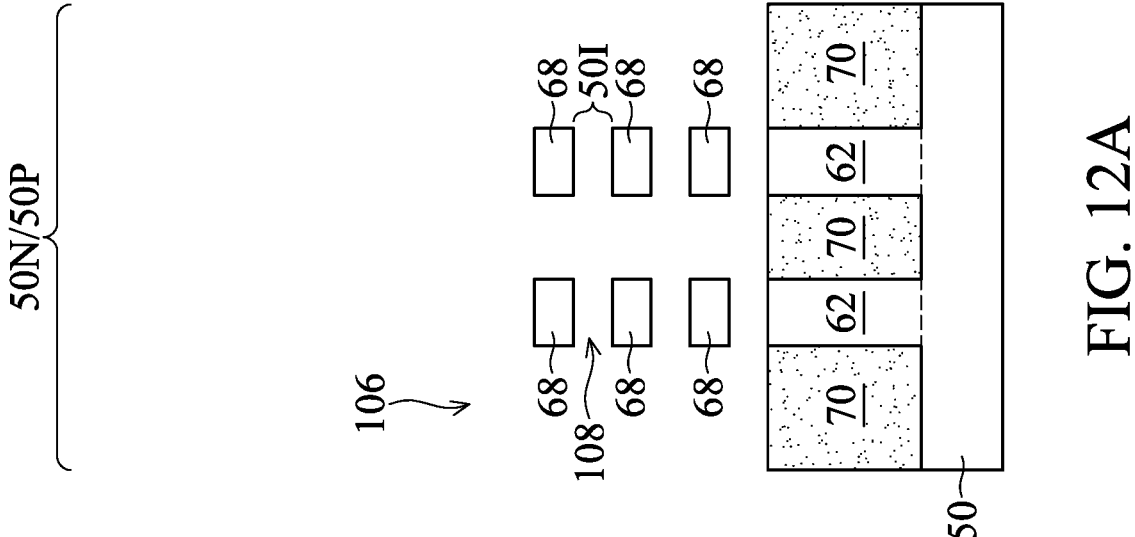

In FIGS. 12A-12B, the masks 86 (if present) and the dummy gates 84 are removed in an etch process, so that recesses 106 are formed. Portions of the dummy dielectrics 82 in the recesses 106 are also removed. In some embodiments, the dummy gates 84 are removed by an anisotropic dry etch. For example, the etch process may include a dry etch using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between and adjoin adjacent pairs of the epitaxial source/drain regions 98.

The remaining portions of the first nanostructures 64 are then removed to expand the recesses 106, such that openings 108 are formed in regions 501 between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide (NH₄OH), or the like. In some embodiments, a trim process (not separately illustrated) is performed to decrease the thicknesses of the exposed portions of the second nanostructures 66 and expand the openings 108.

Figures 13A, 13B:
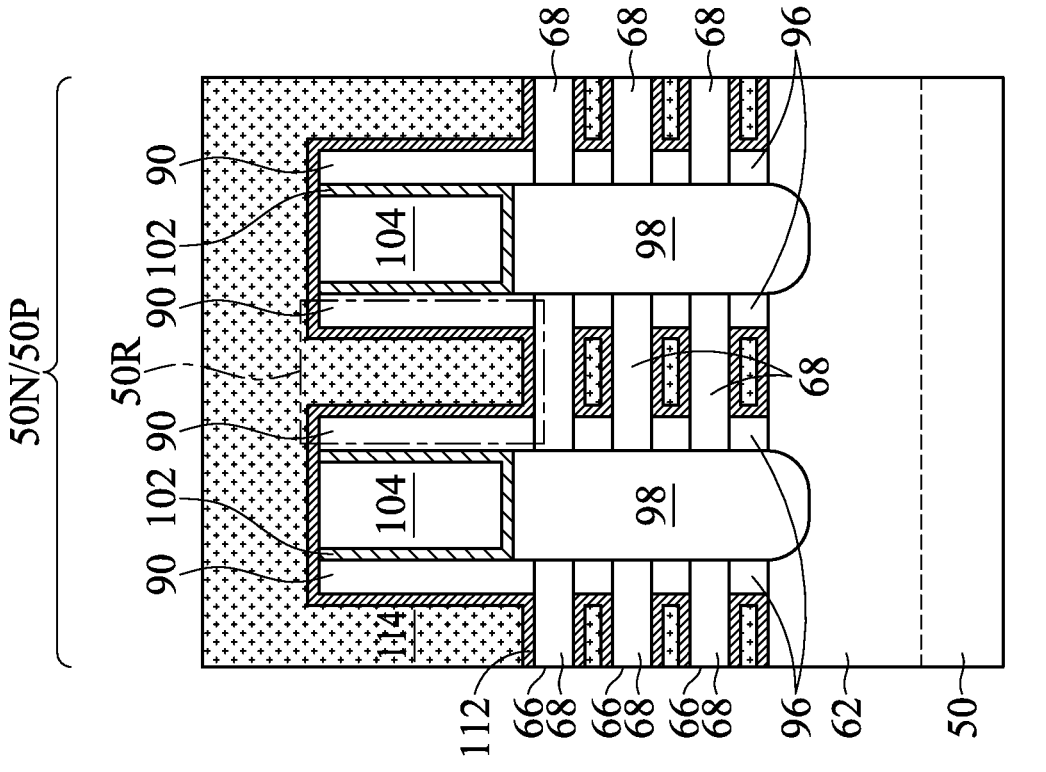

In FIGS. 13A-13B, a gate dielectric layer 112 is formed in the recesses 106 and the openings 108. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a high-dielectric constant (high-k) material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 13A-13B, as will be subsequently described in greater detail, the gate dielectric layer 112 may include multiple layers, such as an interfacial layer and multiple high-k dielectric layers. Each of the layers may be dielectric layers. Further, multiple gate dielectric layers 112 may be formed in different regions of the substrate 50.

The gate electrode layer 114 may include one or more metal-containing material(s) such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A-13B, as will be subsequently described in greater detail, the gate electrode layer 114 may include any number of work function tuning layers, any number of glue layers, and a fill layer. Each of the layers may be metal layers. Further, multiple gate electrode layers 114 may be formed in different regions of the substrate 50.

The formation of the gate dielectric layers 112 in the n-type region 50N and the p-type region 50P may occur simultaneously such that the gate dielectric layers 112 in each region are formed of the same materials, and the formation of the gate electrode layers 114 in the n-type region 50N and the p-type region 50P may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of sub-layers, and/or the gate electrode layers 114 in each region may be formed by distinct processes, such that the gate electrode layers 114 may be different materials and/or have a different number of sub-layers. Various masking steps may be used to mask and expose appropriate regions when using distinct processes.

Although a single gate dielectric layer 112 and a single gate electrode layer 114 are illustrated in FIGS. 13A-13B, as will be subsequently described in greater detail, multiple gate dielectric layers 112 and/or multiple gate electrode layers 114 will be formed in different regions. FIGS. 14-17 illustrate a process in which a gate dielectric layer 112 and gate electrode layers 114 for replacement gates are formed in the recesses 106 and the openings 108, in accordance with some embodiments. Specifically, different gate electrode layers 114 for devices with different work functions will be formed in different regions, such as 50N and/or 50P. FIGS. 14-17 are detailed views of a portion 50R of FIG. 13B, showing the different regions, such as 50N and/or 50P. According to various embodiments, the crystalline phase and grain size of the gate dielectric layer 112 can be controlled to improve the process stability control and the gate length scaling of the devices.

In FIG. 14, the gate dielectric layer 112A is formed on the channel regions 68 in the regions 50N/50P, such that it covers the exposed portions of the channel regions 68 in the recesses 106 and the openings 108 (see FIGS. 12A-12B). The gate dielectric layer 112A may be referred to as an interfacial layer 112A. The interfacial layer 112A may be formed by a selective process such that the interfacial layer 112A is formed on the channel regions 68 but not on the spacers 90. In some embodiments, the interfacial layer 112A is an oxide, such as silicon dioxide or the like. In some embodiments, the interfacial layer 112A is be formed by thermal oxidation, chemical vapor deposition, sputtering, or any other methods known and used in the art for forming an interfacial layer. The interfacial layer 112A wraps around all (e.g., four) sides of the second nanostructures 66 (e.g., channel regions 68).

Further in FIG. 14, a gate dielectric layer 112B is conformally formed on the interfacial layer 112A, side and top surfaces of the gate spacers 90, and on the first ILD 104 (see FIG. 13B). The formation methods of the gate dielectric layer 112B may include deposition methods such as molecular-beam deposition (MBD), ALD, PECVD, and the like. The gate dielectric layer 112B may include a high-dielectric constant (high-k) material having a k-value greater than about 7.0, such as a metal oxide or a silicate of hafnium, aluminum, zirconium, lanthanum, manganese, barium, titanium, lead, and combinations thereof. The gate dielectric layer 112B wraps around all (e.g., four) sides of the second nanostructures 66.

In some embodiments, the gate dielectric layer 112B is a same continuous dielectric layer which is deposited in the recesses 106 and the openings 108 (see FIGS. 12A-12B) in each of the regions 50N and 50P. Thus, the gate dielectric layer 112B is formed of the same material in each of the regions 50N and 50P. In another embodiment, different gate dielectric layers 112B are formed in the regions 50N and 50P by distinct processes, such that the gate dielectric layers 112B include different materials and/or thicknesses.

In some embodiments, the gate dielectric layer 112B is formed as an amorphous gate dielectric layer 112B. After the gate dielectric layer 112B is formed, it is treated by a crystallization process 116 to make it crystalline to enable the gate dielectric layer 112B to be a template layer for an overlying layer such that the grain size can be controlled. The crystallization process 116 crystallizes the gate dielectric layer 112B, such that crystallinity of the material(s) of the gate dielectric layer 112B is increased. For example, the gate dielectric layer 112B may be an amorphous high-k dielectric layer when it is initially deposited, and the crystallization process 116 may at least partially crystallize the amorphous gate dielectric layer to form a crystalline high-k dielectric layer 112B. In some embodiments, the crystallization process 116 includes annealing the gate dielectric layer 112B with an anneal process. Based on the material(s) of the gate dielectric layer 112B, the process conditions (e.g., temperature, pressure, duration, and/or ambient environment) of the anneal process of the crystallization process 116 may be controlled so that the amorphous gate dielectric layer 112B is crystallized to have a desired crystalline structure (e.g., a desired crystalline phase, a desired crystalline orientation, and/or a desired crystalline grain size). In some embodiments, the gate dielectric layer 112B is crystallized to have a crystalline grain size in the range of 10 Å to 100 Å. In some embodiments, the gate dielectric layer 112B is crystallized to have a tetragonal crystalline phase with a (101) plane, a cubic crystalline phase with a (111) plane, an orthorhombic crystalline phase with a (111) plane, or the like.

Figure 18B:
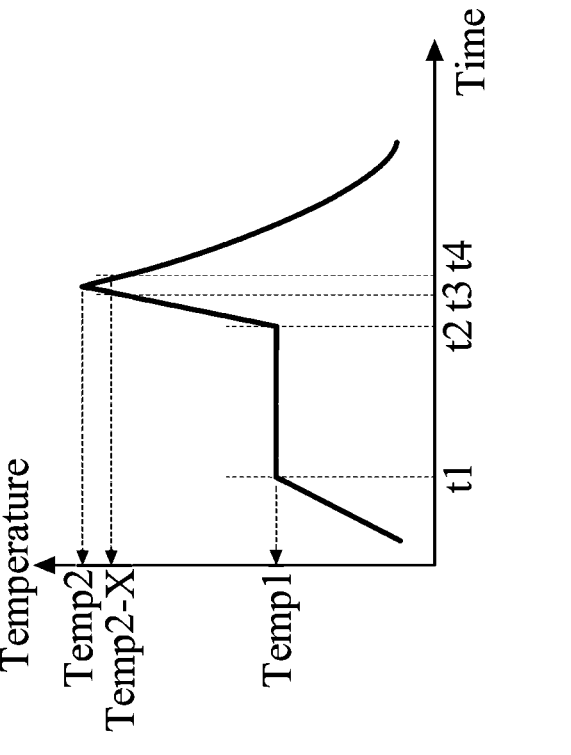
FIGS. 18A and 18B are examples of properties of anneal processes, in accordance with some embodiments.
Figure 18A:
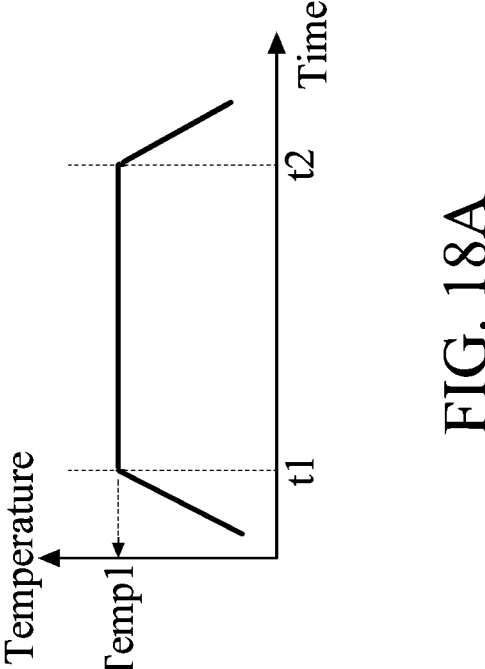

FIGS. 18A and 18B illustrate two different embodiments of the anneal process of the crystallization process 116. FIG. 18A illustrates a soak anneal process. In some embodiments, a soak anneal process used in the crystallization process 116 is performed by annealing the gate dielectric layer 112B at a first temperature (Temp1) in the range of 450° C. to 1050° C., for a time duration (t2–t1) in the range of 5 seconds to 300 seconds, at a pressure in the range of 1 Torr to 760 Torr, and in an ambient environment containing N2. Performing the soak anneal process with process conditions in these ranges crystallizes the material(s) of the gate dielectric layer 112B to have a set of physical properties which results in a desired grain size for acting as a template layer for an overlying layer. Performing the soak anneal process at a temperature of less than 450° C. or for a duration of less than 5 seconds may not sufficiently crystalize the material(s) of the gate dielectric layer 112B. Performing the soak anneal process at a temperature of greater than 1050° C. or for a duration of greater than 300 seconds may cause short-channel effects, such as drain-induced barrier lowering (DIBL), in the resulting devices.

FIG. 18B illustrates a spike anneal process. In some embodiments, a soak anneal process used in the crystallization process 116 is performed by annealing the gate dielectric layer 112B at a first temperature (Temp1) in the range of 450° C. to 750° C., for a first time duration (t2–t1) in the range of 5 seconds to 120 seconds. The temperature is then raised to a second temperature (Temp2) in the range of 650° C. to 1050° C., for a second time duration (t4–t3) in the range of 0.5 seconds to 5 seconds. In some embodiments, the second time duration (t4–t3) is defined as the time that the temperature is greater than or equal to Temp2–X. In some embodiments, the value X a temperature value, such as 50° C. In some other embodiments, the value X is a percentage of Temp2, such as 10% of Temp2. The spike anneal process may be performed at a pressure in the range of _Torr to _Torr, and in an ambient environment containing N2, O2, N2O, NH3, the like, or a combination thereof. Performing the spike anneal process with process conditions in these ranges crystallizes the material(s) of the gate dielectric layer 112B to have a set of physical properties which results in a desired grain size for acting as a template layer for an overlaying layer. Performing the spike anneal process at lower temperatures or for shorter durations of may not sufficiently crystalize the material(s) of the gate dielectric layer 112B. Performing the spike anneal process at greater temperatures or for greater durations may cause short-channel effects, such as drain-induced barrier lowering (DIBL), in the resulting devices.

In some embodiments, the gate dielectric layer 112B has a thickness $T_1$ in the range of 0.5 nm to 10 nm after the crystallization process 116.

In FIG. 15, a gate dielectric layer 112C is conformally formed on the gate dielectric layer 112B. The formation methods of the gate dielectric layer 112C may include deposition methods such as MBD, ALD, PECVD, and the like. The gate dielectric layer 112C may include a high-k material having a k-value greater than 7.0, such as a metal oxide or a silicate of hafnium, aluminum, zirconium, lanthanum, manganese, barium, titanium, lead, and combinations thereof. The gate dielectric layer 112C wraps around all (e.g., four) sides of the second nanostructures 66.

In some embodiments, the gate dielectric layer 112C is a same continuous dielectric layer which is deposited in the recesses 106 and the openings 108 (see FIGS. 12A-12B) in each of the regions 50N and 50P. Thus, the gate dielectric layer 112C is formed of the same material in each of the regions 50N and 50P. In another embodiment, different gate dielectric layers 112C are formed in the regions 50N and 50P by distinct processes, such that the gate dielectric layers 112C include different materials and/or thicknesses.

In an embodiment, the gate dielectric layer 112C is formed as a crystalline gate dielectric layer 112C. In these embodiments, the gate dielectric layer 112C may be epitaxially grown on the gate dielectric layer 112B using the crystalline gate dielectric layer 112B as a template for its formation. In another embodiment, the gate dielectric layer 112C is formed as an amorphous gate dielectric layer 112C. After the gate dielectric layer 112C is formed, it is treated by a crystallization process 118 to make it crystalline to enable the gate dielectric layer 112C to control the grain size of the layer 112C. The crystallization process 118 crystallizes the gate dielectric layer 112C, such that crystallinity of the material(s) of the gate dielectric layer 112C is increased. For example, the gate dielectric layer 112C may be an amorphous high-k dielectric layer when it is initially deposited, and the crystallization process 118 may at least partially crystallize the amorphous high-k dielectric layer to form a crystalline high-k dielectric layer. In some embodiments, the crystallization process 118 includes annealing the gate dielectric layer 112C with an anneal process. The annealing process in the crystallization process 118 may be similar to the processes in FIGS. 18A and 18B described above for layer 112B and their descriptions are not repeated herein. Based on the material(s) of the amorphous high-k dielectric layer 112C, the process conditions (e.g., temperature, pressure, duration, and/or ambient environment) of the anneal process of the crystallization process 116 may be controlled so that the amorphous high-k dielectric layer 112C is crystallized to have a desired crystalline structure (e.g., a desired crystalline phase, a desired crystalline orientation, and/or a desired crystalline grain size). In some embodiments, the gate dielectric layer 112C is crystallized to have a crystalline grain size in the range of 10 Å to 400 Å. In some embodiments, the gate dielectric layer 112C is crystallized to have a tetragonal crystalline phase with a (101) plane, a cubic crystalline phase with a (111) plane, an orthorhombic crystalline phase with a (111) plane, a monoclinic phase with a (−111) or (111) plane, or the like.

In some embodiments, the gate dielectric layer 112C has a thickness $T_2$ in the range of 0.5 nm to 10 nm after the crystallization process 118.

As illustrated, in some embodiments, the gate dielectric layer 112 is multi-layered, including an interfacial layer 112A and overlying high-k dielectric layers 112B and 112C. In a specific embodiment, the interfacial layer 112A may be formed of silicon oxide and the high-k dielectric layers 112B and 112C may be formed of hafnium oxide. The gate dielectric layer 112 may include any acceptable number of sub-layers.

In FIG. 16, a work function tuning layer 120 is conformally formed on the gate dielectric layer 112. The work function tuning layer 120 is formed of a work function material that is acceptable to tune a work function of a nano-FET to a desired amount given the application of the device to be formed, and may be formed by any acceptable deposition process. In some embodiments, the first work function tuning layer 120 is formed of titanium nitride, tungsten, tantalum nitride, titanium aluminide, titanium aluminium nitride, titanium aluminium carbide, or the like, which may be formed by PVD, ALD, CVD, or the like. Although the work function layer 120 is illustrated as a single layer, the work function layer 120 may be multi-layered and include any acceptable number of sub-layers with different work function materials.

In some embodiments, the work function tuning layer 120 is a same continuous dielectric layer which is deposited in the recesses 106 and the openings 108 (see FIGS. 12A-12B) in each of the regions 50N and 50P. Thus, the work function tuning layer 120 is formed of the same material in each of the regions 50N and 50P. In another embodiment, different work function tuning layers 120 are formed in the regions 50N and 50P by distinct processes, such that the work function tuning layers 120 include different materials and/or thicknesses.

In FIG. 17, the remaining portions of the gate electrode layer 114 are formed. In the illustrated embodiment, a fill layer 130 is deposited on the work function tuning layer 120. In some embodiments, a glue layer (not shown) is formed between the fill layer and the work function layer. After formation is complete, the gate electrode layer 114 in each region includes the fill layer 130 and one or more of the work function tuning layers 120. In the illustrated embodiment, the gate electrode layer 114 includes the fill layer 130 and the work function tuning layer 120. The glue layer may be conformally formed on the work function tuning layer 120. The glue layer 128 may be formed of a conductive material such as titanium nitride, tantalum nitride, titanium carbide, tantalum carbide, or the like, which may be formed by a deposition process such as CVD, ALD, PECVD, PVD, or the like. The glue layer may alternately be referred to as an adhesion layer and improves adhesion between the work function tuning layer 120 and the fill layer 130.

The fill layer 130 may be conformally formed on the work function layer 120 (or glue layer if present). In some embodiments, the fill layer 130 may be formed of a conductive material such as cobalt, ruthenium, aluminum, tungsten, combinations thereof, or the like, which may be formed by a deposition process such as CVD, ALD, PECVD, PVD, or the like. The fill layer 130 fills the remaining portions of the recesses 106 and the openings 108 (see FIGS. 12A-12B).

Although the gate electrode layers 114 are illustrated and described as having a particular configuration of the work function tuning layer 120, the gate electrode layers 114 may have other configurations of work function tuning layers in other embodiments. For example, the gate electrode layers 114 may include more or fewer work function tuning layers, depending on the application of the devices to be formed.

Figure 19B:
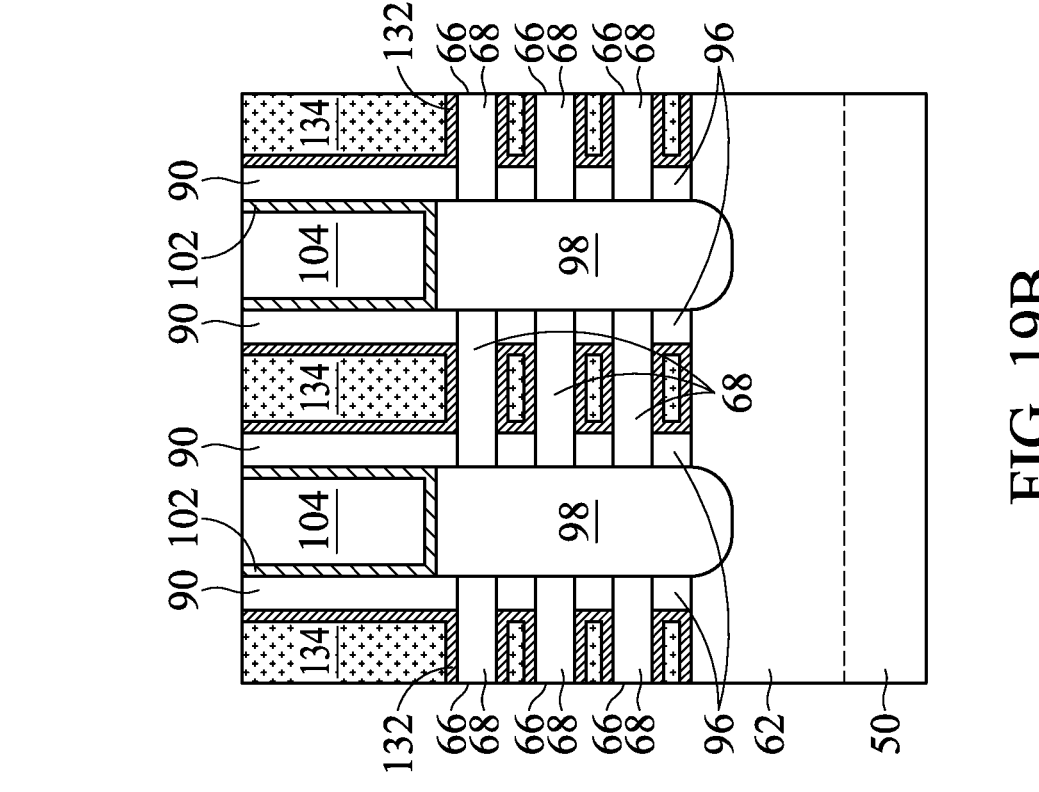
Figure 19A:
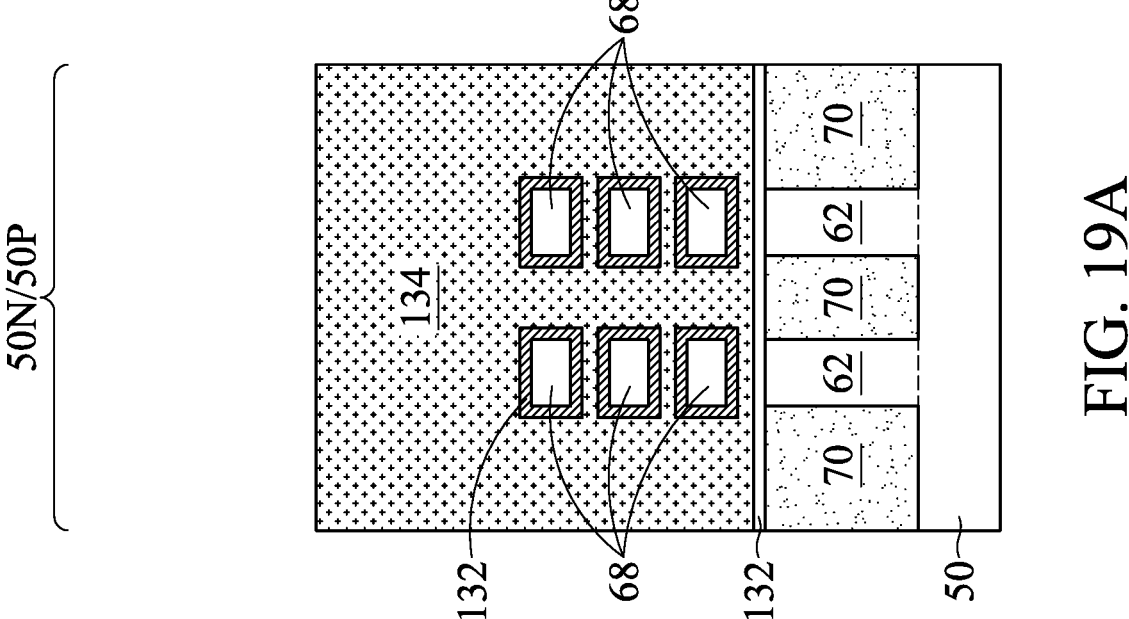

In FIGS. 19A-19B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 132 and gate electrodes 134. In some embodiments, a planarization process such as a chemical mechanical polish (CMP), an etch-back process, combinations thereof, or the like may be utilized. The gate dielectric layer 112, when planarized, has portions left in the recesses 106 and the openings 108 (thus forming the gate dielectrics 132). The gate electrode layer 114, when planarized, has portions left in the recesses 106 and the openings 108 (thus forming the gate electrodes 134). The top surfaces of the gate spacers 90; the CESL 102; the first ILD 104; the gate dielectrics 132 (e.g., the gate dielectric layers 112B and 112C; see FIG. 17); and the gate electrodes 134 (e.g., the fill layer 130 and the work function tuning layer 120; see FIG. 17) are coplanar (within process variations). The gate dielectrics 132 and the gate electrodes 134 form replacement gates of the resulting nano-FETs. Each respective pair of a gate dielectric 132 and a gate electrode 134 may be collectively referred to as a "gate structure." The gate structures each extend along top surfaces, sidewalls, and bottom surfaces of a channel region 68 of the second nanostructures 66.

Figure 20B:
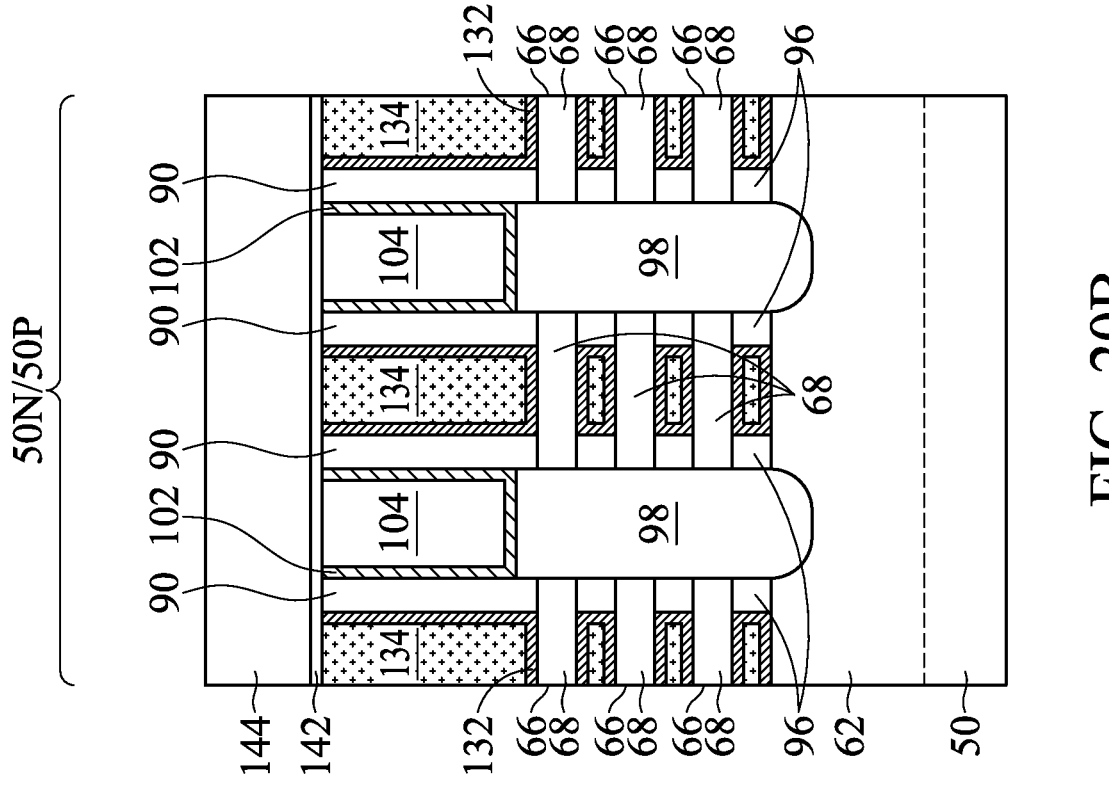
Figure 20A:
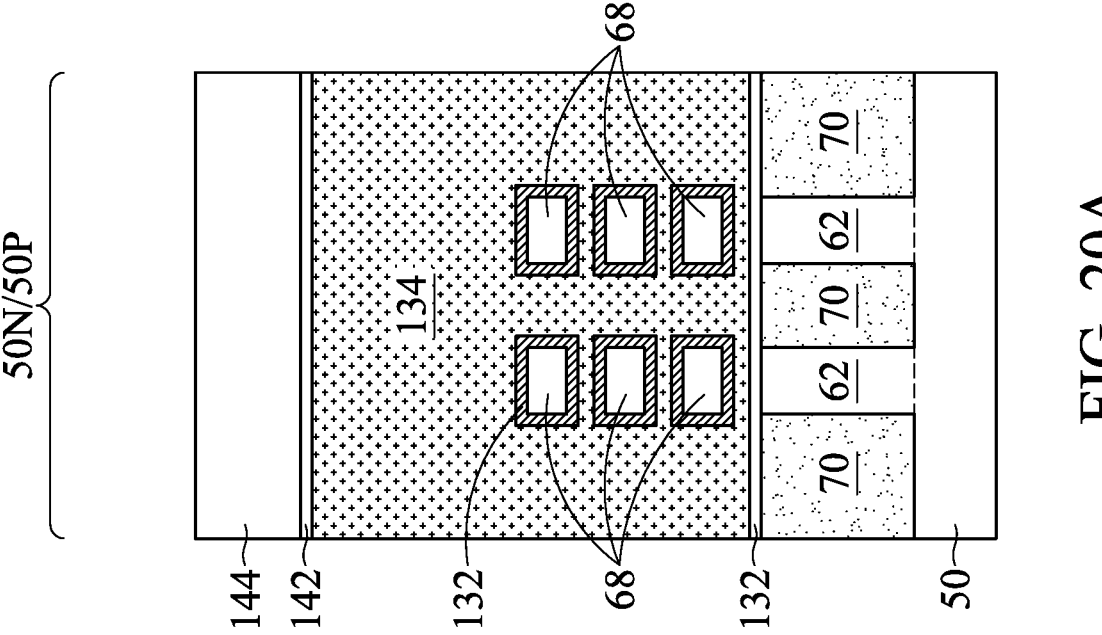

In FIGS. 20A-20B, a second ILD 144 is deposited over the gate spacers 90, the CESL 102, the first ILD 104, the gate dielectrics 132, and the gate electrodes 134. In some embodiments, the second ILD 144 is a flowable film formed by a flowable CVD method. In some embodiments, the second ILD 144 is formed of a dielectric material such as PSG, BSG, BPSG, USG, or the like, which may be formed by any suitable deposition process, such as CVD, PECVD, or the like.

In some embodiments, an etch stop layer (ESL) 142 is formed between the second ILD 144 and the gate spacers 90, the CESL 102, the first ILD 104, the gate dielectrics 132, and the gate electrodes 134. The ESL 142 may be formed of a dielectric material having a high etching selectivity from the etching of the second ILD 144, such as silicon nitride, silicon oxide, silicon oxynitride, or the like, which may be formed by any suitable deposition process, such as CVD, ALD, or the like.

Figure 21B:
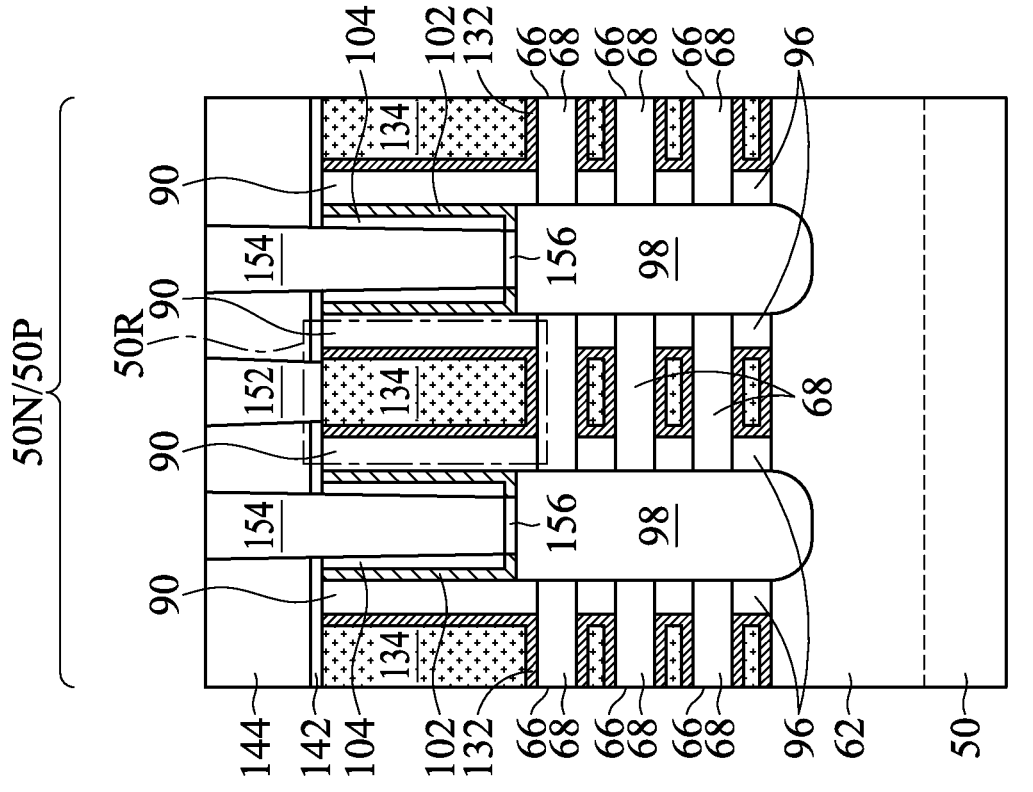
Figure 21A:
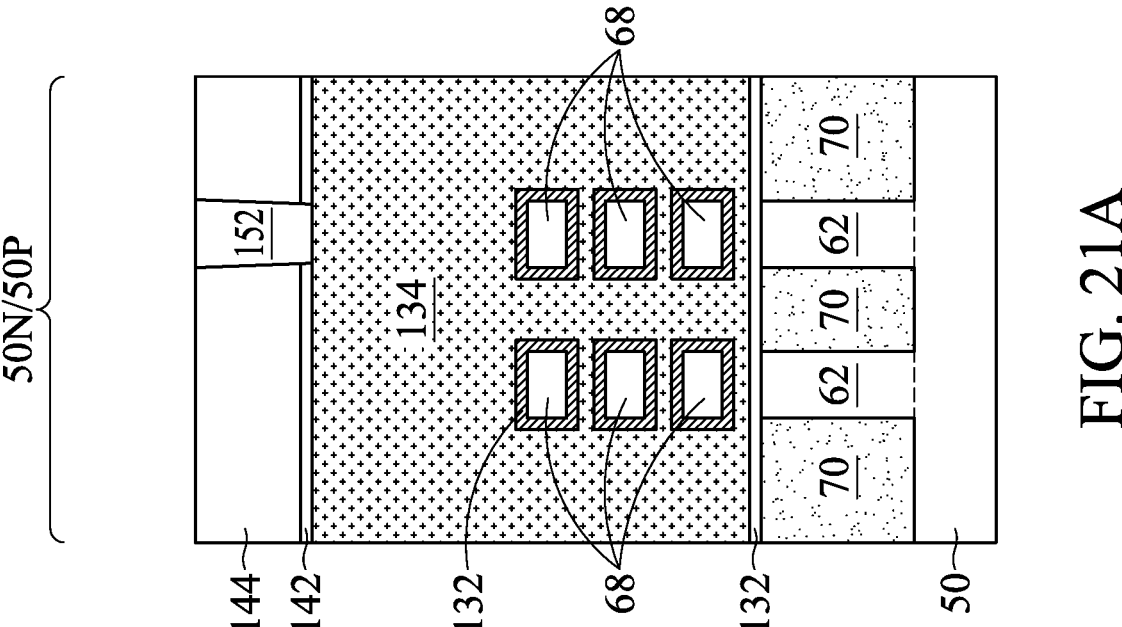

In FIGS. 21A-21B, gate contacts 152 and source/drain contacts 154 are formed to contact, respectively, the gate electrodes 134 and the epitaxial source/drain regions 98. The gate contacts 152 are physically and electrically coupled to the gate electrodes 134. The source/drain contacts 154 are physically and electrically coupled to the epitaxial source/drain regions 98.

As an example to form the gate contacts 152 and the source/drain contacts 154, openings for the gate contacts 152 are formed through the second ILD 144 and the ESL 142, and openings for the source/drain contacts 154 are formed through the second ILD 144, the ESL 142, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 144. The remaining liner and conductive material form the gate contacts 152 and the source/drain contacts 154 in the openings. The gate contacts 152 and the source/drain contacts 154 may be formed in distinct processes, or may be formed in the same process. Although shown as being formed in the same cross-sections, it should be appreciated that each of the gate contacts 152 and the source/drain contacts 154 may be formed in different cross-sections, which may avoid shorting of the contacts.

Optionally, metal-semiconductor alloy regions 156 are formed at the interfaces between the epitaxial source/drain regions 98 and the source/drain contacts 154. The metal-semiconductor alloy regions 156 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 156 can be formed before the material(s) of the source/drain contacts 154 by depositing a metal in the openings for the source/drain contacts 154 and then performing a thermal anneal process. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal anneal process, a cleaning process, such as a wet clean, may be performed to remove any residual metal from the openings for the source/drain contacts 154, such as from surfaces of the metal-semiconductor alloy regions 156. The material(s) of the source/drain contacts 154 can then be formed on the metal-semiconductor alloy regions 156.

Figures 22A, 22B:
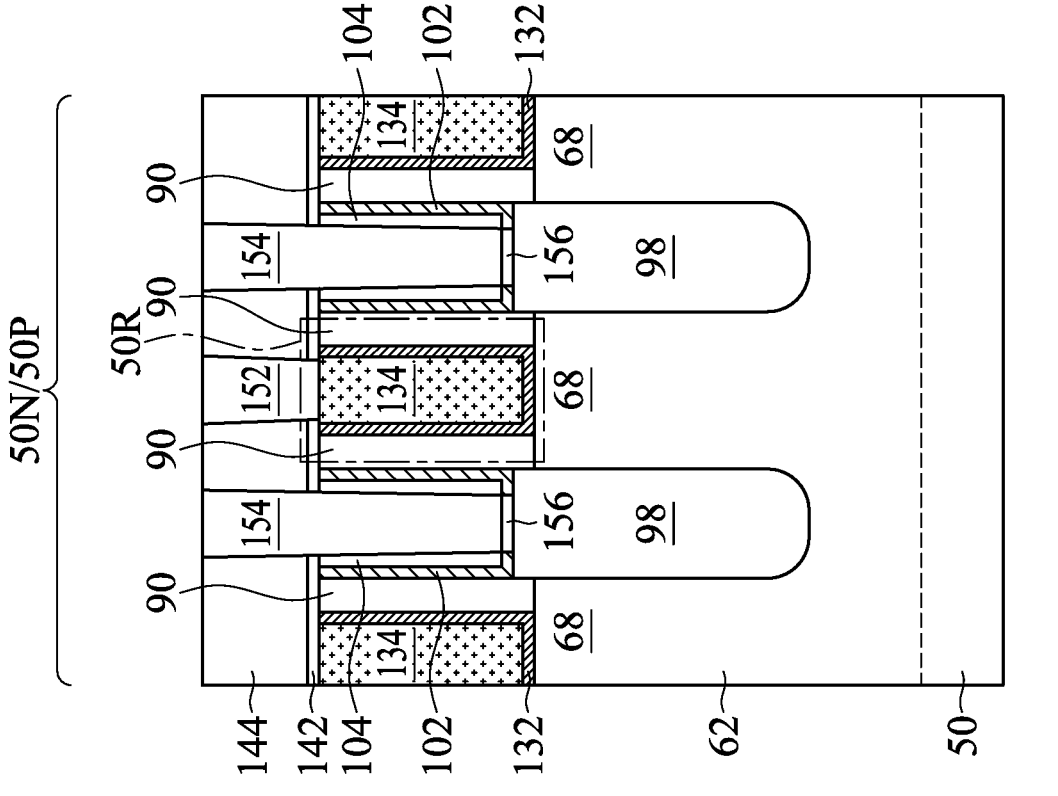
FIGS. 22A and 22B are views of FinFETs, in accordance with some embodiments.

FIGS. 22A-22B are views of FinFETs, in accordance with some embodiments. The FinFETs may be manufactured by a similar process as the nano-FETs previously described, except the nanostructures 64, 66 are omitted. Instead, the fins 62 are semiconductor features which act as channel regions 68 for the FinFETs. The gate structures (including the gate dielectrics 132 and the gate electrodes 134) are formed to extend along the top surfaces and the sidewalls of the channel regions 68 of the fins 62.

FIGS. 23-26 are views of intermediate stages in the manufacturing of nano-FETs, in accordance with some embodiments. Specifically, FIGS. 23-26 illustrate intermediate stages in forming the replacement gate structures including the gate dielectric layers 112 and the gate electrodes 114. The formation of the nano-FETs before and after these steps are similar to those illustrated and described in the embodiments of FIGS. 2-21B are not repeated herein.

In FIG. 23, the interfacial layer 112A is formed on the channel regions 68 in the regions 50N/50P, such that it covers the exposed portions of the channel regions 68 in the recesses 106 and the openings 108 (see FIGS. 12A-12B). The interfacial layer 112A was described above in previous embodiments and the description is not repeated herein.

Further in FIG. 23, a gate dielectric layer 112B is conformally formed on the interfacial layer 112A, side and top surfaces of the gate spacers 90, and on the first ILD 104 (see FIG. 13B). In some embodiments, the formation methods of the gate dielectric layer 112B may include high temperature epitaxy, high temperature ALD, and the like. The materials of the gate dielectric layer 112B were described above in previous embodiments and the description is not repeated herein. In some embodiments, the high temperature epitaxy, high temperature ALD, and the like is performed by at a temperature in the range of 250° C. to 600° C. Performing the formation process(es) with temperatures in these ranges crystallizes the material(s) of the gate dielectric layer 112B to have a set of physical properties which results in a desired grain size for acting as a template layer for an overlaying layer. Performing the formation process(es) at a temperature of less than 250° C. may not sufficiently crystalize the material(s) of the gate dielectric layer 112B. Performing the formation processes at a temperature of greater than 600° C. may not have the desired grain size and/or grain size uniformity.

In some embodiments, the gate dielectric layer 112B is a same continuous dielectric layer which is deposited in the recesses 106 and the openings 108 (see FIGS. 12A-12B) in each of the regions 50N and 50P. Thus, the gate dielectric layer 112B is formed of the same material in each of the regions 50N and 50P. In another embodiment, different gate dielectric layers 112B are formed in the regions 50N and 50P by distinct processes, such that the gate dielectric layers 112B include different materials and/or thicknesses.

By using a high temperature formation process, the gate dielectric layer 112B is formed as a crystalline gate dielectric layer 112B. By forming the gate dielectric layer 112B as a crystalline layer, it enables it to be a template layer for an overlying layer such that the grain size can be controlled. Based on the material(s) of the gate dielectric layer 112B, the process conditions (e.g., temperature, pressure, duration, and/or ambient environment) of the formation process may be controlled so that the gate dielectric layer 112B has a desired crystalline structure (e.g., a desired crystalline phase, a desired crystalline orientation, and/or a desired crystalline grain size). In some embodiments, the gate dielectric layer 112B is crystallized to have a crystalline grain size in the range of 10 Å to 200 Å. In some embodiments, the gate dielectric layer 112B is crystallized to have a tetragonal crystalline phase with a (101) plane, a cubic crystalline phase with a (111) plane, an orthorhombic crystalline phase with a (111) plane, a monoclinic phase with a (−111) or (111) plane, or the like.

In some embodiments, the crystalline gate dielectric layer 112B has a thickness $T_1$ in the range of 0.5 nm to 10 nm.

In FIG. 24, a gate dielectric layer 112C is conformally formed on the gate dielectric layer 112B. The gate dielectric layer 112C may be formed of similar materials and processes as described above in FIG. 15 and the descriptions will not be repeated herein. In an embodiment, the gate dielectric layer 112C is formed as a crystalline gate dielectric layer 112C. In another embodiment, the gate dielectric layer 112C is formed as an amorphous gate dielectric layer 112C. After the gate dielectric layer 112C is formed, it is treated by a crystallization process 118 to make it crystalline to enable the gate dielectric layer 112C to control the grain size of the layer 112C. In these embodiments, the gate dielectric layer 112C may be epitaxially grown on the gate dielectric layer 112B using the crystalline gate dielectric layer 112B as a template for its formation. In some embodiments, the gate dielectric layer 112C is formed to have crystalline grain size in the range of 10 Å to 300 Å. In some embodiments, the gate dielectric layer 112C is crystallized to have a tetragonal crystalline phase with a (101) plane, a cubic crystalline phase with a (111) plane, an orthorhombic crystalline phase with a (111) plane, a monoclinic phase with a (−111) or (111) plane, or the like.

In some embodiments, the gate dielectric layer 112C has a thickness $T_2$ in the range of 0.5 nm to 10 nm after the crystallization process 118.

As illustrated, in some embodiments, the gate dielectric layer 112 is multi-layered, including an interfacial layer 112A and overlying high-k dielectric layers 112B and 112C. In a specific embodiment, the interfacial layer 112A may be formed of silicon oxide and the high-k dielectric layers 112B and 112C may be formed of hafnium oxide. The gate dielectric layer 112 may include any acceptable number of sub-layers.

FIGS. 25 and 26 are similar to the processing described in FIGS. 16 and 17 and the descriptions are not repeated herein. Although the gate electrode layers 114 are illustrated and described as having a particular configuration of the work function tuning layer 120, the gate electrode layers 114 may have other configurations of work function tuning layers in other embodiments. For example, the gate electrode layers 114 may include more or fewer work function tuning layers, depending on the application of the devices to be formed.

Embodiments may achieve advantages. According to various embodiments, replacement gates include gate dielectric layers and gate electrode layers. During formation of the gate dielectric layers, the crystalline phase and grain size of the gate dielectric layer can be controlled to improve the process stability control and the gate length scaling. In some embodiments, a template layer is formed to help control the grain size of the gate dielectric layer. In some embodiments, a crystallization process is performed to help control the grain size of the gate dielectric layer. The crystallization process may include an anneal process, such as a soak anneal, a spike anneal, or both. The grain size of the gate dielectric layer can be sub-nm, such as less than 10 nm. The gate dielectric layer can be a high-k gate dielectric layer.

An embodiment includes a device including a first high-k gate dielectric on a first channel region of a first semiconductor feature, the first high-k gate dielectric being a crystalline layer with a grain size in a range of 10 Å to 200 Å. The device also includes a first gate electrode on the first high-k gate dielectric. The device also includes a source region and a drain region on opposite sides of the first gate electrode.

Embodiments may include one or more of the following features. The device further including a second high-k gate dielectric on a second channel region of a second semiconductor feature, the second high-k gate dielectric being a crystalline layer with a grain size in a range of 10 Å to 300 Å, and a second gate electrode on the second high-k gate dielectric. The first semiconductor feature is a nanostructure and the second semiconductor feature is a fin. The first gate electrode and the second gate electrode are part of a same metal gate line. The first gate electrode and the second gate electrode are part of different metal gate lines. The first high-k gate dielectric includes two sub-layers, with the two sub-layers each being a crystalline layer. The device further including an interfacial layer on the first channel region of the first semiconductor feature, the interfacial layer being between the first high-k gate dielectric and the first channel region, the interfacial layer not being a high-k dielectric layer. The first high-k gate dielectric is a metal oxide or a silicate of hafnium, aluminum, zirconium, lanthanum, manganese, barium, titanium, lead, and combinations thereof.

An embodiment includes forming an interfacial layer on a semiconductor feature. The method also includes forming a first crystalline high-k dielectric layer on the interfacial layer. The method also includes forming a second crystalline high-k dielectric layer on the first crystalline high-k dielectric layer. The method also includes forming a gate electrode on the second crystalline high-k dielectric layer. The method also includes forming a source region and a drain region on opposing sides of the gate electrode.

Embodiments may include one or more of the following features. The method where forming the gate electrode includes depositing a first work function tuning layer on the second crystalline high-k dielectric layer, and depositing a fill layer on the first work function tuning layer. Forming the first crystalline high-k dielectric layer includes depositing a first amorphous high-k dielectric layer on the interfacial layer, and annealing the first amorphous high-k dielectric layer to form the first crystalline high-k dielectric layer. Annealing the first amorphous high-k dielectric layer includes performing a spike anneal process. The spike anneal process is performed at a temperature in a range of 650° C. to 1050° C. and for a duration in a range of 0.5 seconds to 5 seconds. Annealing the first amorphous high-k dielectric layer includes performing a soak anneal process. The soak anneal process is performed at a temperature in a range of 450° C. to 1050° C. and for a duration in a range of 5 seconds to 300 seconds. The first crystalline high-k dielectric layer has a grain size in a range of 10 Å to 200 Å. Forming the first crystalline high-k dielectric layer includes performing a high temperature deposition process.

An embodiment includes forming a source region and a drain region on opposing sides of a first channel region of a semiconductor feature. The method also includes depositing a first amorphous high-k dielectric layer on the first channel region. The method also includes annealing the first amorphous high-k dielectric layer to form a first crystalline high-k dielectric layer. The method also includes forming a second crystalline high-k dielectric layer on the first crystalline high-k dielectric layer. The method also includes forming a gate electrode on the second crystalline high-k dielectric layer.

Embodiments may include one or more of the following features. The method where forming the second crystalline high-k dielectric layer includes depositing a second amorphous high-k dielectric layer on the first crystalline high-k dielectric layer, and annealing the second amorphous high-k dielectric layer to form the second crystalline high-k dielectric layer. The first crystalline high-k dielectric layer has a grain size in a range of 10 Å to 200 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
  a first high-k gate dielectric on a first channel region of a first semiconductor feature, the first high-k gate dielectric comprising a first sub-layer and a second sub-layer over the first sub-layer, the first and second sub-layers each being a crystalline layer, the first sub-layer having a grain size in a range of 10 Å to 100 Å, the second sub-layer having a grain size in a range of 10 Å to 400 Å, wherein the second sub-layer has a grain size greater than the grain size of the first sub-layer;

a first gate electrode on the first high-k gate dielectric; and a source region and a drain region on opposite sides of the first gate electrode.

2. The device of claim 1 further comprising:

a second high-k gate dielectric on a second channel region of a second semiconductor feature, the second high-k gate dielectric being a crystalline layer with a grain size in a range of 10 Å to 300 Å; and a second gate electrode on the second high-k gate dielectric.

3. The device of claim 2, wherein the first semiconductor feature is a nanostructure and the second semiconductor feature is a fin.

4. The device of claim 2, wherein the first gate electrode and the second gate electrode are part of a same metal gate line.

5. The device of claim 2, wherein the first gate electrode and the second gate electrode are part of different metal gate lines.

6. The device of claim 1 further comprising:

an interfacial layer on the first channel region of the first semiconductor feature, the interfacial layer being between the first high-k gate dielectric and the first channel region, the interfacial layer not being a high-k dielectric layer.

7. The device of claim 1, wherein the first high-k gate dielectric is a metal oxide or a silicate of hafnium, aluminum, zirconium, lanthanum, manganese, barium, titanium, lead, and combinations thereof.

8. A method comprising:

forming an interfacial layer on a semiconductor feature;

forming a first crystalline high-k dielectric layer on the interfacial layer, wherein the first crystalline high-k dielectric layer has a grain size in a range of 10 Å to 100 Å;

forming a second crystalline high-k dielectric layer on the first crystalline high-k dielectric layer, wherein forming the second crystalline high-k dielectric layer comprises forming the second crystalline high-k dielectric layer after the first crystalline high-k dielectric layer has been crystallized;

forming a gate electrode on the second crystalline high-k dielectric layer, wherein forming the gate electrode comprises:

depositing a first work function tuning layer on the second crystalline high-k dielectric layer; and depositing a fill layer on the first work function tuning layer; and forming a source region and a drain region on opposing sides of the gate electrode.

9. The method of claim 8, wherein forming the first crystalline high-k dielectric layer comprises:

depositing a first amorphous high-k dielectric layer on the interfacial layer; and annealing the first amorphous high-k dielectric layer to form the first crystalline high-k dielectric layer.

10. The method of claim 9, wherein annealing the first amorphous high-k dielectric layer comprises performing a spike anneal process.

11. The method of claim 10, wherein the spike anneal process is performed at a temperature in a range of 650° C. to 1050° C. and for a duration in a range of 0.5 seconds to 5 seconds.

12. The method of claim 9, wherein annealing the first amorphous high-k dielectric layer comprises performing a soak anneal process.

13. The method of claim 12, wherein the soak anneal process is performed at a temperature in a range of 450° C. to 1050° C. and for a duration in a range of 5 seconds to 300 seconds.

14. The method of claim 8, wherein forming the first crystalline high-k dielectric layer comprises performing a high temperature deposition process.

15. The method of claim 8, wherein the first work function tuning layer comprises a material selected from the group consisting of titanium nitride, tungsten, tantalum nitride, titanium aluminide, titanium aluminum nitride, and titanium aluminum carbide, and wherein the fill layer comprises a material selected from the group consisting of cobalt, ruthenium, aluminum, and tungsten.

16. The method of claim 8, wherein the second crystalline high-k dielectric layer has a grain size in a range of 10 Å to 400 Å.

17. A method comprising:

forming a source region and a drain region on opposing sides of a first channel region;

depositing a first amorphous high-k dielectric layer on the first channel region;

annealing the first amorphous high-k dielectric layer at a first temperature to form a first crystalline high-k dielectric layer, wherein the first crystalline high-k dielectric layer has a grain size in a range of 10 Å to 100 Å;

depositing a second amorphous high-k dielectric layer on the first crystalline high-k dielectric layer;

annealing the second amorphous high-k dielectric layer at a second temperature to form a second crystalline high-k dielectric layer, wherein the second crystalline high-k dielectric layer has a grain size in a range of 10 Å to 400 Å, and wherein the second crystalline high-k dielectric layer has a grain size greater than the grain size of the first crystalline high-k dielectric layer; and forming a gate electrode on the second crystalline high-k dielectric layer.

18. The method of claim 17, wherein the first temperature is different from the second temperature.

19. The method of claim 17, wherein annealing the first amorphous high-k dielectric layer comprises performing a soak anneal process at a temperature in a range of 450° C. to 1050° C. for a duration in a range of 5 seconds to 300 seconds.

20. The method of claim 17, wherein the first crystalline high-k dielectric layer and the second crystalline high-k dielectric layer each comprise a metal oxide or a silicate of hafnium, aluminum, zirconium, lanthanum, manganese, barium, titanium, lead, and combinations thereof.

* * * * *